(12) United States Patent
Seok et al.

(10) Patent No.: US 12,033,706 B2
(45) Date of Patent: Jul. 9, 2024

(54) METHOD OF OPERATING NONVOLATILE MEMORY DEVICE, NONVOLATILE MEMORY DEVICE AND MEMORY CONTROLLER PERFORMING THE SAME

(71) Applicant: SAMSUNG ELECTRONICS CO., LTD., Suwon-si (KR)

(72) Inventors: Junyeong Seok, Seoul (KR); Younggul Song, Hwaseong-si (KR); Eunchu Oh, Hwaseong-si (KR); Byungchul Jang, Suwon-si (KR); Joonsung Lim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 149 days.

(21) Appl. No.: 17/873,739

(22) Filed: Jul. 26, 2022

(65) Prior Publication Data
US 2023/0052161 A1 Feb. 16, 2023

(30) Foreign Application Priority Data
Aug. 12, 2021 (KR) .......................... 10-2021-0106446

(51) Int. Cl.
*G11C 16/34* (2006.01)
*G11C 16/08* (2006.01)
*G11C 16/10* (2006.01)
*G11C 16/16* (2006.01)

(52) U.S. Cl.
CPC .......... *G11C 16/3459* (2013.01); *G11C 16/08* (2013.01); *G11C 16/102* (2013.01); *G11C 16/16* (2013.01)

(58) Field of Classification Search
CPC ... G11C 16/3459; G11C 16/08; G11C 16/102; G11C 16/16
See application file for complete search history.

(56) References Cited

U.S. PATENT DOCUMENTS

| | | | |
|---|---|---|---|
| 8,234,545 B2 | 7/2012 | Shalvi et al. | |
| 8,589,766 B2 | 11/2013 | Post et al. | |
| 9,059,736 B2 | 6/2015 | Danilak et al. | |
| 9,977,712 B2 * | 5/2018 | Park | G11C 29/52 |
| 10,157,099 B2 * | 12/2018 | Ou | G11C 29/52 |
| 10,614,891 B2 | 4/2020 | Park et al. | |

(Continued)

FOREIGN PATENT DOCUMENTS

| KR | 10-1419335 B1 | 7/2014 |
|---|---|---|
| KR | 10-2019-0026431 A | 3/2019 |

*Primary Examiner* — Son L Mai
(74) *Attorney, Agent, or Firm* — Sughrue Mion, PLLC

(57) ABSTRACT

In a method of operating one or more nonvolatile memory devices including one or more memory blocks, each memory block includes a plurality of memory cells and a plurality of pages arranged in a vertical direction. Pages arranged in a first direction of a channel hole are set as first to N-th pages. A size of the channel hole increases in the first direction and decreases in the second direction. Pages arranged in a second direction of the channel hole are set as (N+1)-th to 2N-th pages. First to N-th page pairs are set such that a K-th page among the first to the N-th pages and an (N+K)-th page among the (N+1)-th to 2N-th pages form one page pair. Parity regions of two pages included in at least one page pair are shared by the two pages included in the at least one page pair.

20 Claims, 25 Drawing Sheets

(56) References Cited

U.S. PATENT DOCUMENTS

| | | |
|---|---|---|
| 10,971,235 B2 | 4/2021 | Park et al. |
| 2012/0254686 A1 | 10/2012 | Esumi et al. |
| 2019/0377632 A1 | 12/2019 | Oh et al. |
| 2020/0402590 A1 | 12/2020 | Park et al. |
| 2021/0210147 A1 | 7/2021 | Park et al. |

* cited by examiner

METHOD OF OPERATING NONVOLATILE MEMORY DEVICE, NONVOLATILE MEMORY DEVICE AND MEMORY CONTROLLER PERFORMING THE SAME

CROSS-REFERENCE TO RELATED APPLICATION

This application claims priority under 35 USC § 119 to Korean Patent Application No. 10-2021-0106446, filed on Aug. 12, 2021 in the Korean Intellectual Property Office (KIPO), the contents of which are herein incorporated by reference in their entirety.

BACKGROUND

1. Field

Example embodiments relate generally to semiconductor integrated circuits, and more particularly to methods of operating nonvolatile memory devices, nonvolatile memory devices performing the methods, and memory controllers performing the methods.

2. Description of Related Art

Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered. Recently, semiconductor memory devices having memory cells that are stacked "vertically" (i.e., in three dimensions (3D)) have been researched to improve the capacity and integration density of the semiconductor memory devices.

SUMMARY

At least one example embodiment of the present disclosure provides a method of operating a nonvolatile memory device that includes memory cells stacked in three dimensions capable of minimizing performance loss while maintaining reliability characteristic.

At least one example embodiment of the present disclosure provides a nonvolatile memory device and a memory controller that perform the method of operating the nonvolatile memory device.

According to some aspects of example embodiments, in a method of operating one or more nonvolatile memory devices including one or more memory blocks, each memory block includes a plurality of memory cells and a plurality of pages that are connected to a plurality of wordlines and arranged in a vertical direction. Pages arranged in a first direction of a channel hole are set as a first page to an N-th page, N being a natural number greater than or equal to two, the channel hole extending in the vertical direction, a size of the channel hole increasing in the first direction. Pages arranged in a second direction of the channel hole are set as an (N+1)-th page to a 2N-th page, the size of the channel hole decreasing in the second direction. A first page pair to an N-th page pair are set such that a K-th page, among the first to the N-th pages, and an (N+K)-th page, among the (N+1)-th to the 2N-th pages, form one page pair, K being a natural number greater than or equal to one and less than or equal to N. The first to the N-th page pairs are driven such that parity regions of two pages included in at least one page pair of the first to the N-th page pairs are shared by the two pages included in the at least one page pair.

According to some aspects of example embodiments, a nonvolatile memory device includes one or more memory blocks, each memory block including a plurality of memory cells and a plurality of pages that are connected to a plurality of wordlines and arranged in a vertical direction, each memory block including a channel hole that extends in the vertical direction; and a control circuit configured to control an operation of the memory block, wherein the control circuit is further configured to: set pages arranged in a first direction of the channel hole as a first page to an N-th page, N being a natural number greater than or equal to two, a size of the channel hole increasing in the first direction; set pages arranged in a second direction of the channel hole as an (N+1)-th page to an 2N-th page, the size of the channel hole decreasing in the second direction; set a first page pair to an N-th page pair such that a K-th page, among the first to the N-th pages, and an (N+K)-th page, among the (N+1)-th to the 2N-th pages, form one page pair, K being a natural number greater than or equal to one and less than or equal to N; and drive the first to the N-th page pairs such that parity regions of two pages included in at least one page pair of the first to the N-th page pairs are shared by the two pages included in the at least one page pair.

According to some aspects of example embodiments, in a method of operating one or more nonvolatile memory devices including one or more memory blocks, each memory block includes a plurality of memory cells and a plurality of pages that are connected to a plurality of wordlines and arranged in a vertical direction. Pages arranged in a first direction of a channel hole are set as a first page to an N-th page, N being a natural number greater than or equal to two, the channel hole extending in the vertical direction, a size of the channel hole increasing in the first direction. Pages arranged in a second direction of the channel hole are set as an (N+1)-th page to an 2N-th page, the size of the channel hole decreasing in the second direction. A first page pair to an N-th page pair are set such that a K-th page, among the first to the N-th pages, and an (N+K)-th page, among the (N+1)-th to the 2N-th pages, form one page pair, K being a natural number greater than or equal to one and less than or equal to N. A data write operation is performed on the first page pair including the first page and the (N+1)-th page by receiving first data, second data, first parity data associated with the first data, and second parity data associated with the second data, by storing the first data and a portion of the first parity data in the first page, and by storing the second data, the second parity data, and a remaining portion of the first parity data in the (N+1)-th page. A data read operation is performed on the first page pair by retrieving the first data and the portion of the first parity data that are stored in the first page and the remaining portion of the first parity data that is stored in the (N+1)-th page, and by recovering the first data based on the portion of the first parity data or based on the portion and the remaining portion of the first parity data.

According to some aspects of example embodiments, a memory controller that controls one or more nonvolatile memory devices including one or more memory blocks includes a processor and an error correction code (ECC) engine. Each memory block includes a plurality of memory cells and a plurality of pages that are connected to a plurality of wordlines and arranged in a vertical direction. The processor is configured to set pages arranged in a first direction of a channel hole as a first page to an N-th page, N being a natural number greater than or equal to two, the channel hole extending in the vertical direction, a size of the channel hole increasing in the first direction; set pages arranged in a second direction of the channel hole as an (N+1)-th page to an 2N-th page, the size of the channel hole decreasing in the second direction; set a first page pair to an N-th page pair such that a K-th page, among the first to the N-th pages, and an (N+K)-th page, among the (N+1)-th to 2N-th pages, form one page pair, K being a natural number greater than or equal to one and less than or equal to N; and based on the first to the N-th page pairs being to be driven, generate a command and an address such that parity regions of two pages included in at least one page pair of the first to the N-th page pairs are shared by the two pages included in the at least one page pair. The ECC engine is configured to perform an ECC encoding and an ECC decoding. Based on a data write operation being performed on the first page pair including the first page and the (N+1)-th page, the ECC engine is further configured to generate first parity data associated with first data to be stored in the first page and second parity data associated with second data to be stored to the (N+1)-th page, and a size of the first parity data is larger than a size of the second parity data.

In the method of operating the nonvolatile memory device, the nonvolatile memory device and the memory controller according to example embodiments, the pages may be numbered or addressed in different schemes or manners depending on the size of the channel hole and the reliability of the page, two pages with different sizes of the channel hole and different reliability characteristics may be set as one page pair, and the data write operation and/or the data read operation may be performed using the page pairs. For example, a portion of the parity data corresponding to the page having relatively low reliability may be stored in the parity region of the page having relatively high reliability. Accordingly, using less parity data, the loss in performance (e.g., latency) may be minimized without degrading the reliability characteristic.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
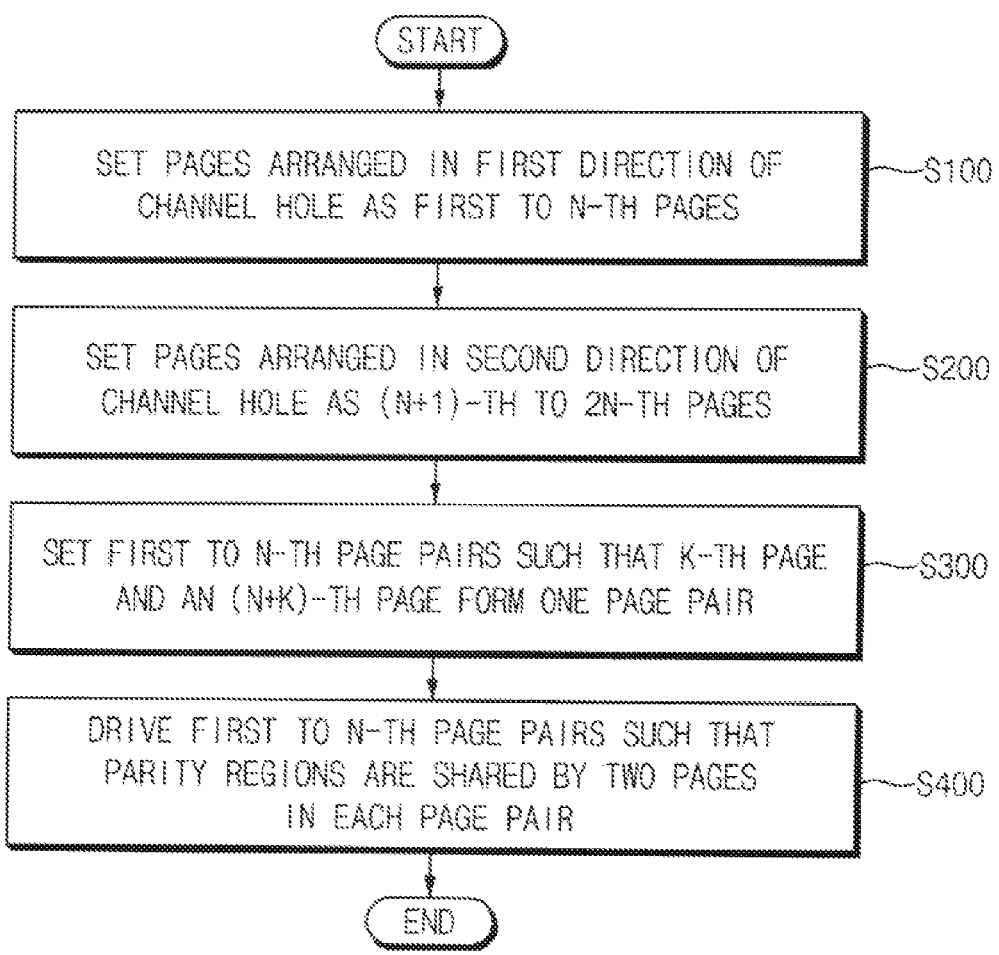
FIG. 1 is a flowchart illustrating a method of operating a nonvolatile memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flowchart illustrating a method of operating a nonvolatile memory device according to example embodiments.

Referring to FIG. 1, a method of operating a nonvolatile memory device according to example embodiments is performed by a nonvolatile memory device including one or more memory blocks. Each memory block in the nonvolatile memory device includes a plurality of memory cells and a plurality of pages that are connected to a plurality of wordlines and arranged in a vertical direction. Examples of configurations of the nonvolatile memory device and the memory block will be described in detail with reference to FIGS. 2, 3, 4, 5, 6A and 6B.

In the method of operating the nonvolatile memory device according to example embodiments, pages arranged in a first direction of a channel hole are set or determined as first to N-th pages (step S100), and pages arranged in a second direction of the channel hole are set or determined as (N+1)-th to 2N-th pages (step S200), where N is a natural number greater than or equal to two. The first direction represents a direction in which a size of the channel hole increases, and the second direction representing a direction in which the size of the channel hole decreases.

The channel hole is a structure extending in the vertical direction for forming the plurality of wordlines. For example, the channel hole may be formed to implement the memory block in which the plurality of memory cells and the plurality of pages are arranged in the vertical direction. Configurations of the channel hole will be described in detail with reference to FIGS. 3, 5, 6A and 6B.

In some example embodiments, the first direction and the second direction may be opposite to each other. In other words, an order of numbering and/or addressing the (N+1)-th to 2N-th pages may be a reverse order of numbering and/or addressing the first to N-th pages. For example, both the first direction and the second direction may be directions parallel to the vertical direction.

In some example embodiments, among the first to N-th pages, a size of the channel hole corresponding to the first page may be the smallest size, and a size of the channel hole corresponding to the N-th page may be the largest size. For example, the size of the channel hole may represent a diameter or a radius of the channel hole on a plane or in a plan view. For example, as will be described with reference to FIGS. 5, 6A and 6B, the larger the size of the channel hole, the higher (or better) the reliability of the page, and the smaller the size of the channel hole, the lower (or worse) the reliability of the page. Thus, among the first to N-th pages, the first page may have the lowest reliability, and the N-th page may have the highest reliability. In other words, the channel hole may have first to N-th portions corresponding to the first to N-th pages, the first to N-th portions of the channel hole may have first to N-th sizes, respectively, the first size may be the smallest one among the first to N-th sizes, and the N-th size may be the largest one among the first to N-th sizes.

In some example embodiments, among the (N+1)-th to 2N-th pages, a size of the channel hole corresponding to the (N+1)-th page may be the largest size, and a size of the channel hole corresponding to the 2N-th page may be the smallest size. For example, among the (N+1)-th to 2N-th pages, the (N+1)-th page may have the highest reliability, and the 2N-th page may have the lowest reliability. In other words, the channel hole may have (N+1)-th to 2N-th portions corresponding to the (N+1)-th to 2N-th pages, the (N+1)-th to 2N-th portions of the channel hole may have (N+1)-th to 2N-th sizes, respectively, the (N+1)-th size may be the largest one among the (N+1)-th to 2N-th sizes, and the 2N-th size may be the smallest one among the (N+1)-th to 2N-th sizes.

First to N-th page pairs are set or determined such that a K-th page among the first to N-th pages and an (N+K)-th page among the (N+1)-th to 2N-th pages form one page pair (step S300), where K is a natural number greater than or equal to one and less than or equal to N. For example, the first page and the (N+1)-th page may be set as the first page pair, a second page and an (N+2)-th page may be set as a second page pair, and the N-th page and the 2N-th page may be set as the N-th page pair.

In some example embodiments, two pages included in one page pair may have different channel hole sizes and different reliability. For example, as described above, the first to N-th pages are set in the direction in which the size of the channel hole and the reliability are increased; the (N+1)-th to 2N-th pages are set in the direction in which the size of the channel hole and the reliability are decreased; and the first to N-th page pairs are set as in step S300. Accordingly, the first page pair may include the first page that corresponds to the smallest size of the channel hole and has the lowest reliability among the first to N-th pages, and may include the (N+1)-th page that corresponds to the largest size of the channel hole and has the highest reliability among the (N+1)-th to 2N-th pages.

Configurations of the first to N-th pages, the (N+1)-th to 2N-th pages and the first to N-th page pairs will be described in detail with reference to FIGS. 7A, 7B, 7C, 8A, 8B, 8C, 9, 10 and 11.

The first to N-th page pairs are driven or operate such that parity regions of two pages included in each page pair are shared by the two pages included in each page pair (step S400). For example, step S400 may include at least one of a data write operation and a data read operation performed on at least one page pair. For example, each page may include a data region storing data (e.g., actual data) and a parity region storing parity data, and the parity regions of two pages included in each page pair may be shared by storing a part of the parity data corresponding to one of the two pages in the parity region of the other of the two pages. Step S400 will be described in detail with reference to FIGS. 12 through 21.

In the nonvolatile memory device including the memory block in which the plurality of memory cells and the plurality of pages are arranged in the vertical direction, the channel hole may extend in the vertical direction for forming the plurality of wordlines. Due to the characteristics of the manufacturing process, the size of the channel hole may vary depending on a location or a position at which the channel hole is etched, and thus it may cause differences in the reliability characteristics of the memory cells and the pages.

In the method of operating the nonvolatile memory device according to example embodiments, the pages may be numbered or addressed in different schemes or manners depending on the size of the channel hole and the reliability of the page, two pages with different sizes of the channel hole and different reliability characteristics may be set as one page pair, and the data write operation and/or the data read operation may be performed using the page pairs. For example, a portion of the parity data corresponding to the page having relatively low reliability (and thus requiring more parity data) may be stored in the parity region of the page having relatively high reliability (and thus requiring less parity data). Accordingly, using less parity data (e.g., less parity data because of the relatively high reliability of the page in which the portion of the parity data is stored), the loss in performance (e.g., latency) may be minimized without degrading the reliability characteristic.

Figure 2:
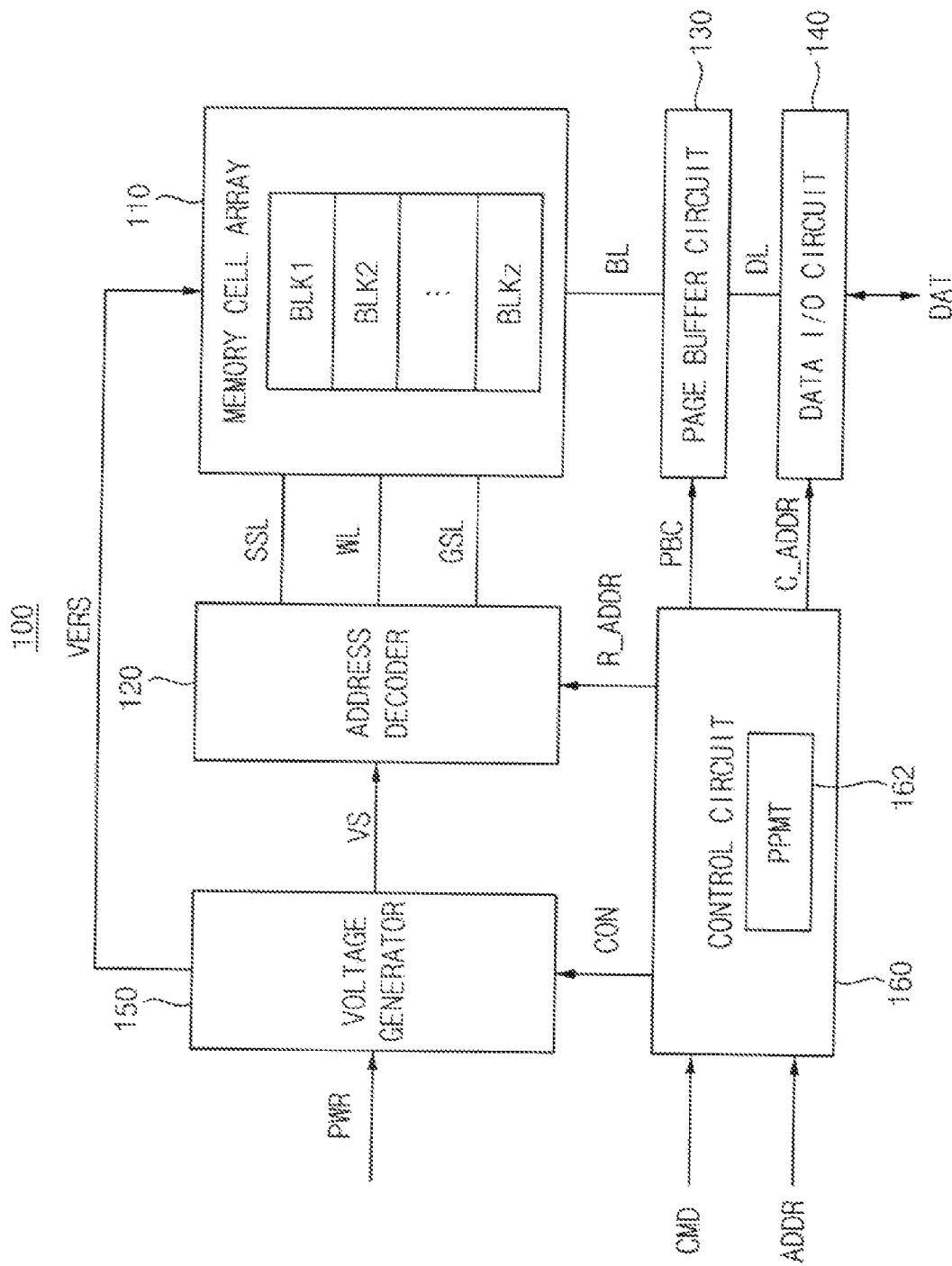
FIG. 2 is a block diagram illustrating a nonvolatile memory device according to example embodiments.

FIG. 2 is a block diagram illustrating a nonvolatile memory device according to example embodiments.

Referring to FIG. 2, a nonvolatile memory device 100 includes a memory cell array 110, an address decoder 120, a page buffer circuit 130, a data input/output (I/O) circuit 140, a voltage generator 150 and a control circuit 160.

The memory cell array 110 is connected to the address decoder 120 via a plurality of string selection lines SSL, a plurality of wordlines WL and a plurality of ground selection lines GSL. The memory cell array 110 is further connected to the page buffer circuit 130 via a plurality of bitlines BL. The memory cell array 110 may include a plurality of memory cells (e.g., a plurality of nonvolatile memory cells) that are connected to the plurality of wordlines WL and the plurality of bitlines BL. The memory cell array 110 may be divided into a plurality of memory blocks BLK1, BLK2, . . . , BLKz each of which includes memory cells. In addition, each of the plurality of memory blocks BLK1, BLK2, . . . , BLKz may be divided into a plurality of pages. In some example embodiments, each of the plurality of memory blocks BLK1, BLK2, . . . , BLKz may be divided into two or more sub-blocks.

In some example embodiments, as will be described with reference to FIGS. 3 and 4, the memory cell array 110 may be a three-dimensional (3D) memory cell array, which is formed on a substrate in a three-dimensional structure (or a vertical structure). In this example, the memory cell array 110 may include a plurality of cell strings (e.g., a plurality of vertical NAND strings) that are vertically oriented such that at least one memory cell is located over another memory cell.

The control circuit 160 receives a command signal including a command CMD and an address signal including an address ADDR from an outside (e.g., from a memory controller 600 in FIG. 22), and control erasure, programming and/or read operations of the nonvolatile memory device 100 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and a data recover read operation.

For example, the control circuit 160 may generate control signals CON, which are used for controlling the voltage generator 150, and may generate a control signal PBC for controlling the page buffer circuit 130, based on the command CMD, and may generate a row address R_ADDR and a column address C_ADDR based on the address ADDR. The control circuit 160 may provide the row address R_ADDR to the address decoder 120 and may provide the column address C_ADDR to the data I/O circuit 140.

In addition, the control circuit 160 may control the address decoder 120, the page buffer circuit 130, the data I/O circuit 140 and the voltage generator 150 such that the nonvolatile memory device 100 performs the method of operating the nonvolatile memory device according to example embodiments described with reference to FIG. 1. For example, the control circuit 160 may include a page pair mapping table (PPMT) 162 that includes a relationship between the first to N-th page pairs and page addresses of the first to N-th pages and the (N+1)-th to 2N-th pages.

The address decoder 120 may be connected to the memory cell array 110 via the plurality of string selection lines SSL, the plurality of wordlines WL and the plurality of ground selection lines GSL.

For example, in the data erase/write/read operations, the address decoder 120 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the address decoder 120 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the address decoder 120 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 150 may generate voltages VS that are required for an operation of the nonvolatile memory device 100 based on a power PWR and the control signals CON. The voltages VS may be applied to the plurality of string selection lines SSL, the plurality of wordlines WL and the plurality of ground selection lines GSL via the address decoder 120. In addition, the voltage generator 150 may generate an erase voltage VERS that is required for the data erase operation based on the power PWR and the control signals CON. The erase voltage VERS may be applied to the memory cell array 110 directly or via the bitline BL.

For example, during the erase operation, the voltage generator 150 may apply the erase voltage VERS to a common source line and/or the bitline BL of a memory block (e.g., a selected memory block) and may apply an erase permission voltage (e.g., a ground voltage) to all of wordlines of the memory block or a portion of the wordlines via the address decoder 120. In addition, during the erase verification operation, the voltage generator 150 may apply an erase verification voltage simultaneously to all of wordlines of the memory block or sequentially to the wordlines one by one.

For example, during the program operation, the voltage generator 150 may apply a program voltage to the selected wordline and may apply a program pass voltage to the unselected wordlines via the address decoder 120. In addition, during the program verification operation, the voltage generator 150 may apply a program verification voltage to the selected wordline and may apply a verification pass voltage to the unselected wordlines via the address decoder 120.

In addition, during the normal read operation, the voltage generator 150 may apply a read voltage to the selected wordline and may apply a read pass voltage to the unselected wordlines via the address decoder 120. During the data recover read operation, the voltage generator 150 may apply the read voltage to a wordline adjacent to the selected wordline and may apply a recover read voltage to the selected wordline via the address decoder 120.

The page buffer circuit 130 may be connected to the memory cell array 110 via the plurality of bitlines BL. The page buffer circuit 130 may include a plurality of page buffers. In some example embodiments, each page buffer may be connected to one bitline. In other example embodiments, each page buffer may be connected to two or more bitlines.

The page buffer circuit 130 may store data DAT to be programmed into the memory cell array 110 or may read data DAT sensed from the memory cell array 110. In other words, the page buffer circuit 130 may operate as a write driver or a sensing amplifier according to an operation mode of the nonvolatile memory device 100.

The data I/O circuit 140 may be connected to the page buffer circuit 130 via data lines DL. The data I/O circuit 140 may provide the data DAT from an outside of the nonvolatile memory device 100 (e.g., from the memory controller 600 in FIG. 22) to the memory cell array 110 via the page buffer circuit 130 or may provide the data DAT from the memory cell array 110 to the outside of the nonvolatile memory device 100 (e.g., to the memory controller 600 in FIG. 22), based on the column address C_ADDR.

Figure 3:
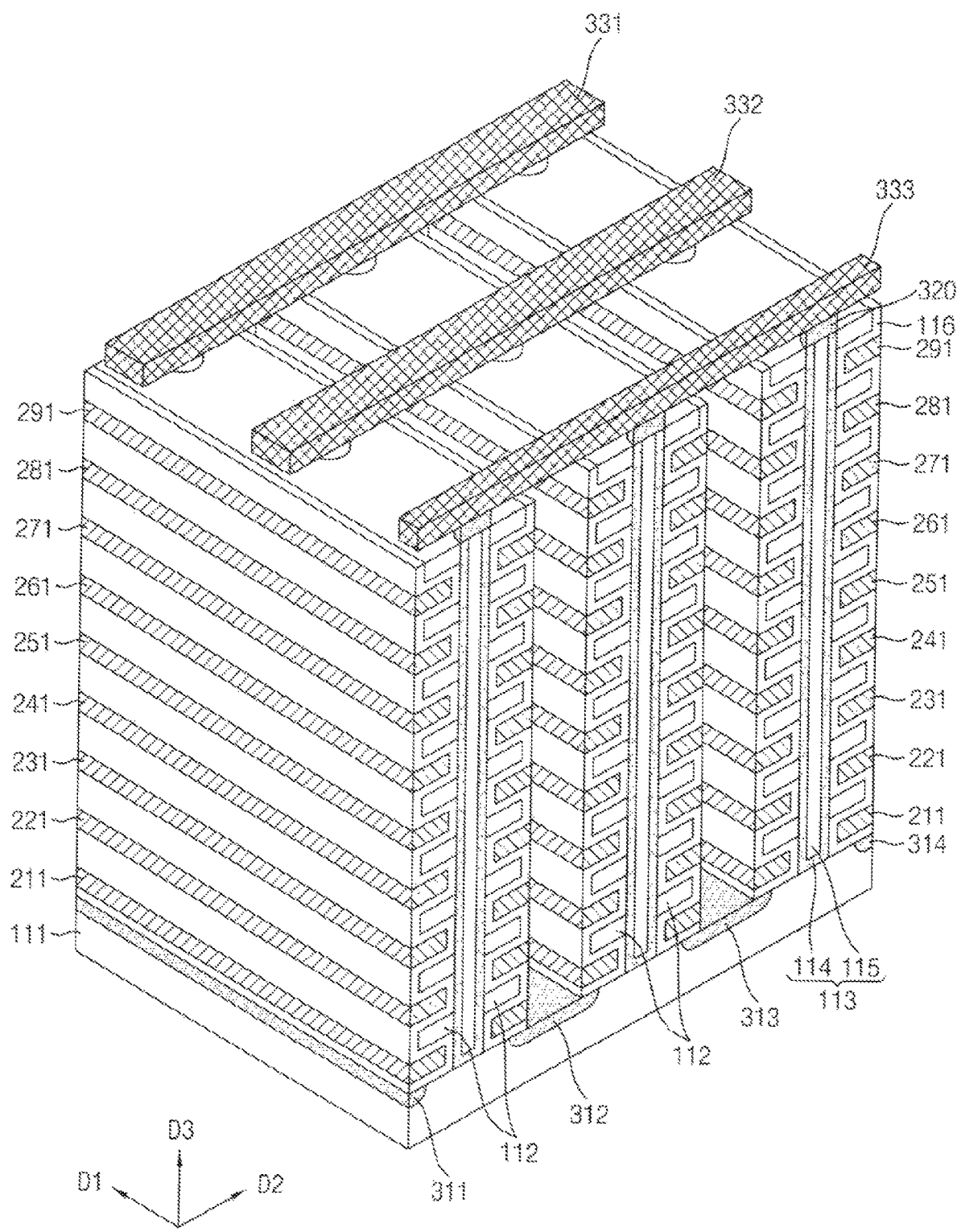
FIG. 3 is a perspective view illustrating an example of a memory block included in a memory cell array in a nonvolatile memory device of FIG. 2.

FIG. 3 is a perspective view illustrating an example of a memory block included in a memory cell array in a nonvolatile memory device of FIG. 2.

Referring to FIG. 3, a memory block BLKi includes a plurality of cell strings (e.g., a plurality of vertical NAND strings) which are formed on a substrate in a three-dimensional structure (or a vertical structure). The memory block BLKi includes structures extending along first, second and third directions D1, D2 and D3.

A substrate 111 is provided. For example, the substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. In an embodiment, the substrate 111 has a p-type well (or a p-type pocket well). However, the conductive type of the substrate 111 is not limited to p-type.

A plurality of doping regions 311, 312, 313 and 314 arranged along the second direction D2 are provided in and/or on the substrate 111. These plurality of doping regions 311 to 314 may have a second type of charge carrier impurity (e.g., a second conductivity type) different from the first type of the substrate 111. In one embodiment of the disclosure, the first to fourth doping regions 311 to 314 may have n-type. However, the conductive type of the first to fourth doping regions 311 to 314 is not limited to n-type.

A plurality of insulation materials 112 extending along the first direction D1 are sequentially provided along the third direction D3 on a region of the substrate 111 between the first and second doping regions 311 and 312. For example, the plurality of insulation materials 112 are provided along the third direction D3, being spaced from one another by a specific distance. For example, the insulation materials 112 may include an insulation material such as an oxide layer.

A plurality of pillars 113 penetrating the insulation materials along the third direction D3 are sequentially disposed along the first direction D1 on a region of the substrate 111 between the first and second doping regions 311 and 312. For example, the plurality of pillars 113 penetrate the insulation materials 112 to contact the substrate 111.

In some example embodiments, each pillar 113 may include a plurality of materials. For example, a channel layer 114 of each pillar 113 may include a silicon material having a first conductivity type. For example, the channel layer 114 of each pillar 113 may include a silicon material having the same conductivity type as the substrate 111. In one embodiment of the disclosure, the channel layer 114 of each pillar 113 includes p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In some examples, the internal material 115 of each pillar 113 may include an air gap. The term "air" as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 need not be provided between the first conductive materials 211 to 291 corresponding to ground selection lines GSL (e.g., 211) and string selection lines SSL (e.g., 291). In this example, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 above a specific insulation material among the insulation materials 112 and the insulation layer 116 below the specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may be formed of a conductive metal, but in other embodiments of the disclosure the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, a plurality of insulation materials 112 are provided, which extend along the first direction D1. A plurality of pillars 113 are provided that are disposed sequentially along the first direction D1 and penetrate the plurality of insulation materials 112 along the third direction D3. An insulation layer 116 is provided on the exposed surfaces of the plurality of insulation materials 112 and the plurality of pillars 113, and a plurality of first conductive materials 211 to 291 extend along the first direction D1. Similarly, the same structures as those on the first and second doping regions 311 and 312 may be provided in a region between the third and fourth doping regions 313 and 314.

A plurality of drain regions 320 are provided on the plurality of pillars 113, respectively. The drain regions 320 may include silicon materials doped with a second type of charge carrier impurity. For example, the drain regions 320 may include silicon materials doped with an n-type dopant. In one embodiment of the disclosure, the drain regions 320 include n-type silicon materials. However, the drain regions 320 are not limited to n-type silicon materials.

On the drain regions, a plurality of second conductive materials 331, 332 and 333 are provided, which extend along the second direction D2. The second conductive materials 331 to 333 are disposed along the first direction D1, being spaced apart from each other by a specific distance. The second conductive materials 331 to 333 are respectively connected to the drain regions 320 in a corresponding region. The drain regions 320 and the second conductive materials 331 to 333 extending along the second direction D2 may be connected through each contact plug. Each contact plug may be, for example, a conductive plug formed of a conductive material such as a metal. The second conductive materials 331 to 333 may include metal materials. The second conductive materials 331 to 333 may include conductive materials such as a polysilicon.

In the example of FIG. 3, the first conductive materials 211 to 291 may be used to form the wordlines WL, the string selection lines SSL and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be variously determined according to process and control techniques.

Figure 4:
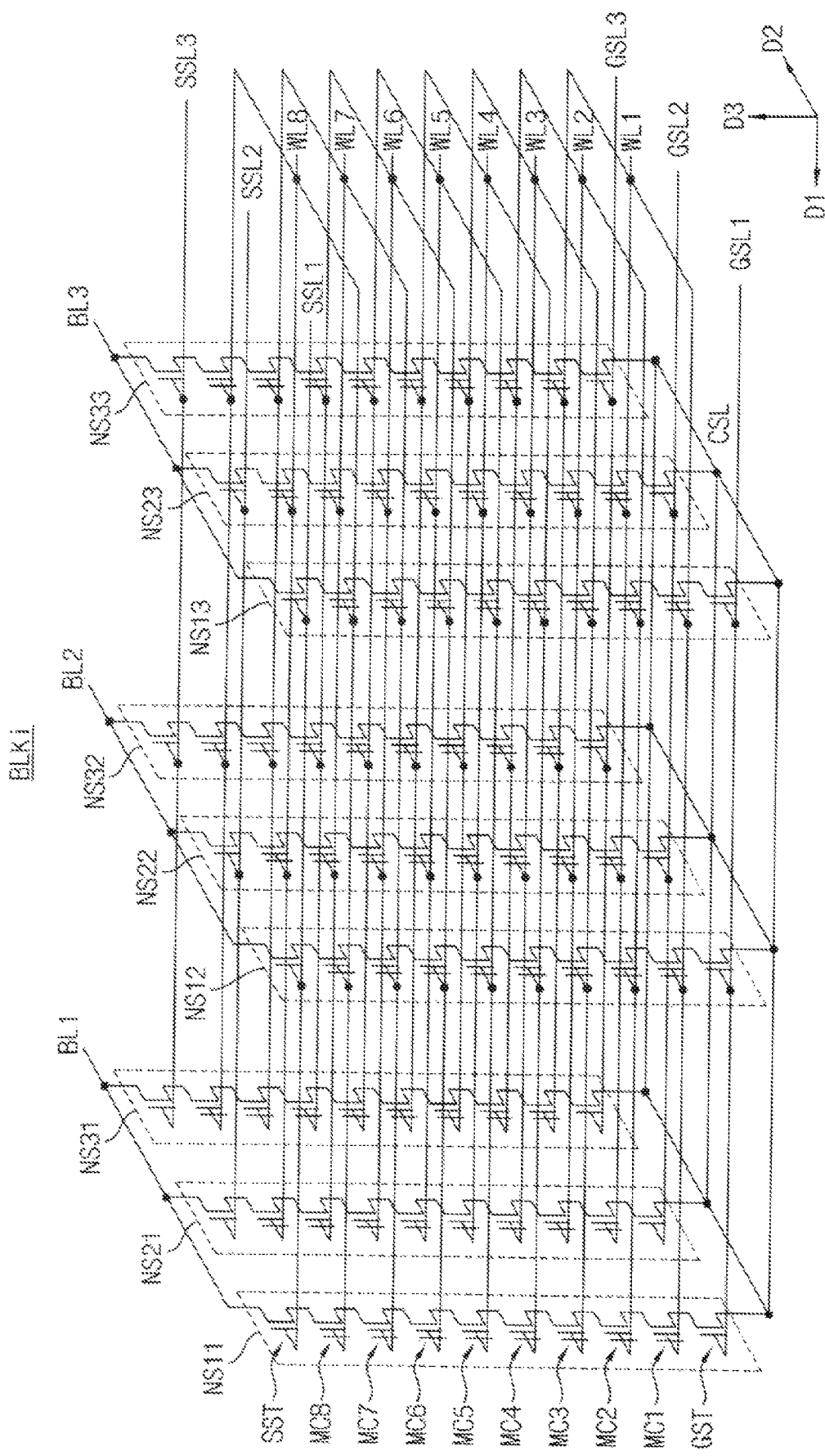
FIG. 4 is a circuit diagram illustrating an equivalent circuit of a memory block described with reference to FIG. 3.

FIG. 4 is a circuit diagram illustrating an equivalent circuit of a memory block described with reference to FIG. 3.

A memory block BLKi of FIG. 4 may be formed on a substrate in a three-dimensional structure (or a vertical structure). For example, a plurality of NAND strings included in the memory block BLKi may be formed in a direction perpendicular to the substrate.

Referring to FIG. 4, the memory block BLKi may include a plurality of NAND strings NS11, NS12, NS13, NS21, NS22, NS23, NS31, NS32 and NS33 connected between bitlines BL1, BL2 and BL3 and a common source line CSL. Each of the NAND strings NS11 to NS33 may include a string selection transistor SST, a plurality of memory cells MC1, MC2, MC3, MC4, MC5, MC6, MC7 and MC8, and a ground selection transistor GST. For example, the bitlines BL1 to BL3 may correspond to the second conductive materials 331 to 333 in FIG. 3, and the common source line CSL may be formed by interconnecting the first to fourth doping regions 311 to 314 in FIG. 3.

Each string selection transistor SST may be connected to a corresponding string selection line (one of SSL1, SSL2 and SSL3). The plurality of memory cells MC1 to MC8 may be connected to corresponding wordlines WL1, WL2, WL3, WL4, WL5, WL6, WL7 and WL8, respectively. Each ground selection transistor GST may be connected to a corresponding ground selection line (one of GSL1, GSL2 and GSL3). Each string selection transistor SST may be connected to a corresponding bitline (e.g., one of BL1 to BL3), and each ground selection transistor GST may be connected to the common source line CSL. In the example of FIG. 4, some of the string selection transistors SST are connected to the same bitline (e.g., one of BL1 to BL3) to connect corresponding NAND strings to the same bitline up appropriate selection via selection voltages applied to the appropriate sting selection lines SSL1 to SSL3 and ground selection lines GSL1 to GSL3.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, and the ground selection lines GSL1 to GSL3 and the string selection lines SSL1 to SSL3 may be separated. Memory cells located at the same semiconductor layer share a wordline. Cell strings in the same row share a string selection line. The common source line CSL is connected in common to all of cell strings.

In FIG. 4, the memory block BLKi is illustrated to be connected to eight wordlines WL1 to WL8 and three bitlines BL1 to BL3, and each of the NAND strings NS11 to NS33 is illustrated to include eight memory cells MC1 to MC8. However, example embodiments are not limited thereto. In some example embodiments, each memory block may be connected to any number of wordlines and bitlines, and each NAND string may include any number of memory cells.

A three-dimensional vertical array structure may include vertical NAND strings that are vertically oriented such that at least one memory cell is located over another memory cell. The at least one memory cell may include a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to example embodiments is described based on a NAND flash memory device, the nonvolatile memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 5:
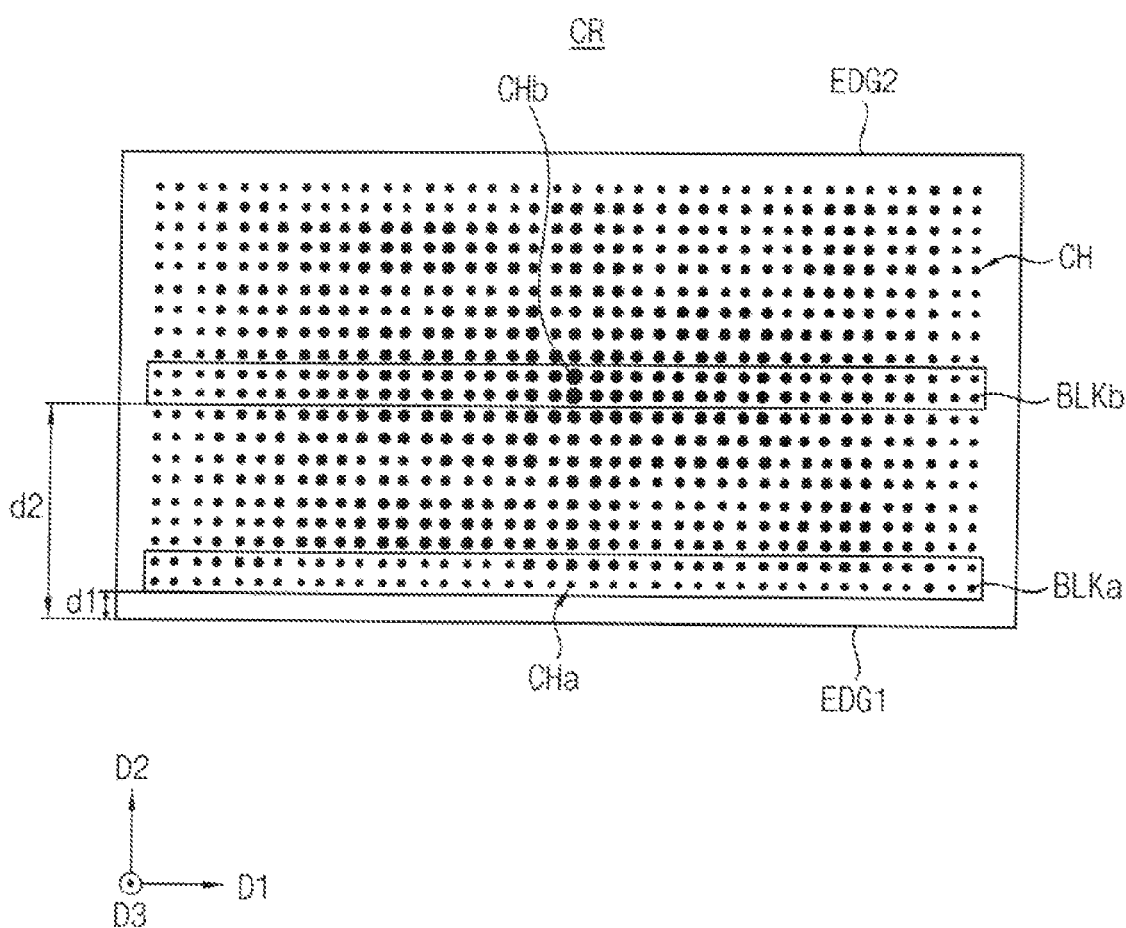
FIG. 5 is a plan view of an example of a cell region included in a memory cell array of FIGS. 3 and 4.

FIG. 5 is a plan view of an example of a cell region included in a memory cell array of FIGS. 3 and 4.

Referring to FIG. 5, a cell region CR may include a plurality of channel holes CH.

A channel hole size, for example, a channel hole diameter, may vary according to positions within the cell region CR. For example, portions adjacent to first and second edges EDG1 and EDG2 may have a relatively low peripheral density, and thus channel holes CHa adjacent to the first and second edges EDG1 and EDG2 may have different diameters from those of the other channel holes CH. Channel holes CHb located in a center of the cell region CR may have diameters larger than those of the channel holes CHa adjacent to the first and second edges EDG1 and EDG2. A memory block BLKa may be adjacent to the second edge EDG2, and may be spaced apart from the second edge EDG2 by a first distance d1. A memory block BLKb may not be adjacent to the first and second edges EDG1 and EDG2, may be in the center of the cell region CR, and may be spaced apart from the second edge EDG2 by a second distance d2. The second distance d2 may be greater than the first distance d1. A first diameter of the channel hole CHa included in the memory block BLKa may be smaller than a second diameter of the channel hole CHb included in the memory block BLKb.

Figure 6A:
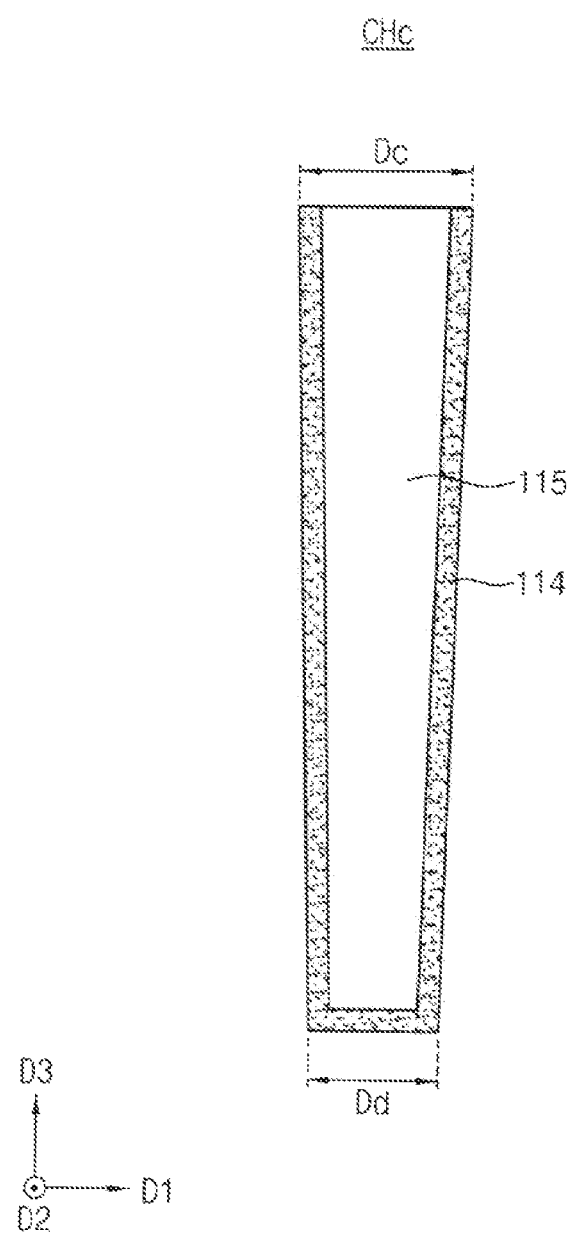
FIGS. 6A and 6B are cross-sectional views of examples of a channel hole formed in a cell region of FIG. 5.
Figure 6B:
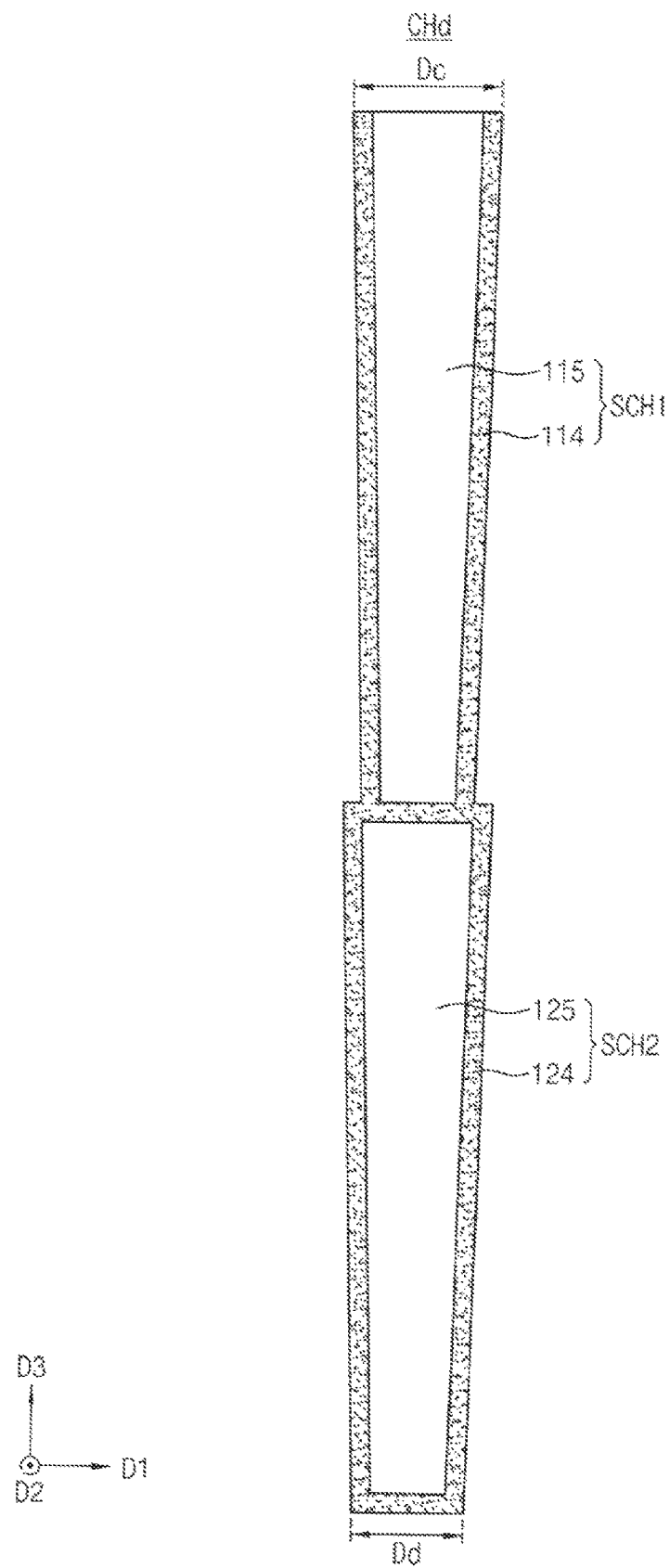

FIGS. 6A and 6B are cross-sectional views of examples of a channel hole formed in a cell region of FIG. 5.

Referring to FIG. 6A, a pillar including a channel layer 114 and an internal layer 115 may be formed in a channel hole CHc. For example, the channel hole CHc may be drilled from the top to the bottom, and a diameter Dc on a position where the formation of the channel hole CHc starts (e.g., on the top) may be larger than a diameter Dd on a position where the formation of the channel hole CHc ends (e.g., on the bottom). For example, the channel hole CHc may be included in one memory block.

Referring to FIG. 6B, a channel hole CHd may include a first sub-channel hole SCH1 and a second sub-channel hole SCH2. As with the channel hole CHc of FIG. 6A, a pillar including a channel layer 114 and an internal layer 115 may be formed in the first sub-channel hole SCH1, and a pillar including a channel layer 124 and an internal layer 125 may be formed in the second sub-channel hole SCH2. For example, the channel hole CHd may be included in one memory block. For example, each of the sub-channel holes SCH1 and SCH2 may be included in one sub-block in one memory block.

FIG. 6B illustrates a two-stacked structure in which two sub-channel holes SCH1 and SCH2 are sequentially formed or extended along the third direction D3 (e.g., the vertical direction) within one channel hole CHd. For example, the second sub-channel hole SCH2 that is a lower sub-channel hole may be formed first, and then the first sub-channel hole SCH1 that is an upper sub-channel hole may be formed later. However, example embodiments are not limited thereto, and three or more sub-channel holes may be included in one channel hole.

As described above, the diameter of the channel hole may vary depending on the third direction D3 within one channel hole. Due to the difference in the channel hole diameter (or size), a difference in the characteristics of the memory cells and/or pages may occur.

In the method of operating the nonvolatile memory device according to example embodiments, two pages with different channel hole sizes and different reliability characteristics may be set as one page pair, and the parity regions of two pages included in each page pair may be shared by the two pages included in each page pair. Accordingly, the performance degradation may be prevented while maintaining the reliability characteristic.

FIGS. 7A, 7B, 7C, 8A, 8B, 8C, 9, 10 and 11 are diagrams illustrating examples of pages and page pairs in a method of operating a nonvolatile memory device according to example embodiments. FIGS. 7A, 7B, 7C, 8A, 8B, 8C, 9, 10 and 11 illustrate results of steps S100, S200 and S300 in FIG. 1 being performed.

Figure 7A:
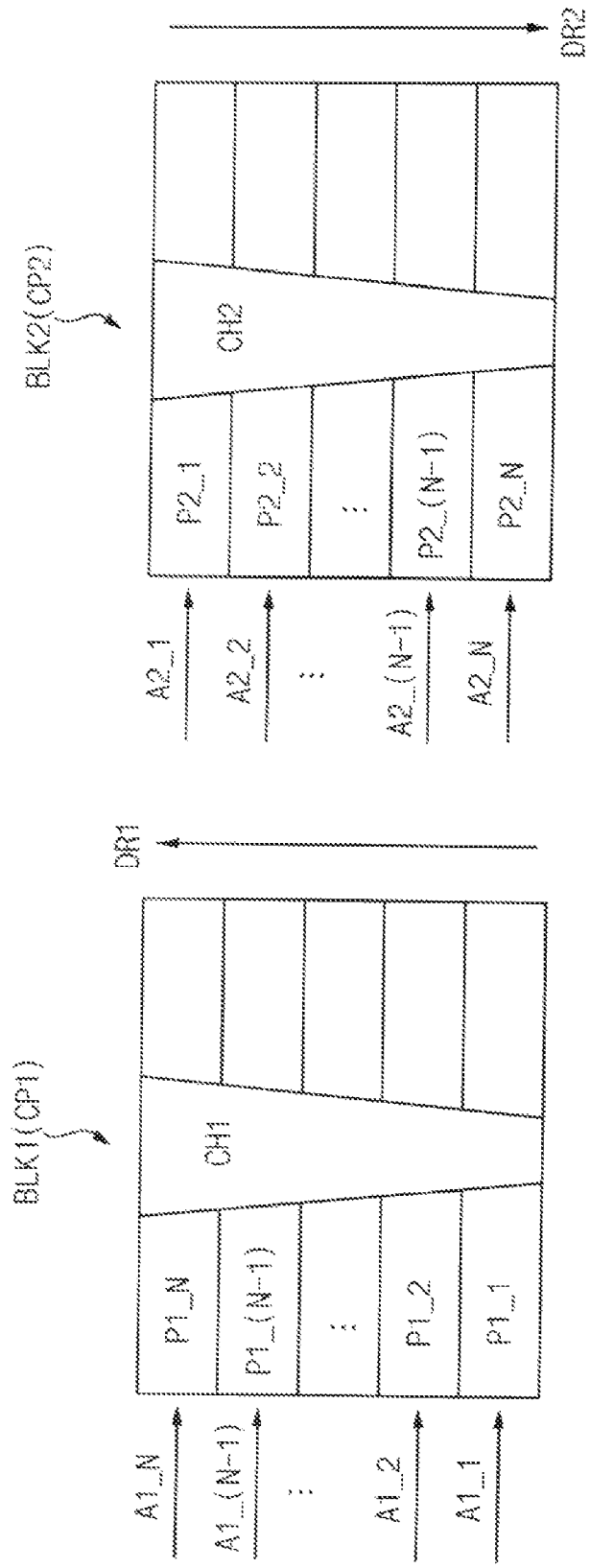
FIGS. 7A, 7B, 7C, 8A, 8B, 8C, 9, 10 and 11 are diagrams illustrating examples of pages and page pairs in a method of operating a nonvolatile memory device according to example embodiments.

Referring to FIG. 7A, an example (e.g., a multi-chip structure) where two pages included in one page pair are included in different memory blocks and different devices or chips is illustrated.

For example, first to N-th pages P1_1, P1_2, . . . , P1_(N−1), P1_N may be included in a first memory block BLK1, and (N+1)-th to 2N-th pages P2_1, P2_2, . . . , P2_(N−1), P2_N may be included in a second memory block BLK2 different from the first memory block BLK1. The first to N-th pages P1_1 to P1_N may be sequentially arranged along a first channel hole CH1 included in the first memory block BLK1 and may be sequentially arranged in a first direction DR1. The (N+1)-th to 2N-th pages P2_1 to P2_N may be sequentially arranged along a second channel hole CH2 included in the second memory block BLK2 and may be sequentially arranged in a second direction DR2. The first memory block BLK1 may be included in a first nonvolatile memory device (or chip) CP1, and the second memory block BLK2 may be included in a second nonvolatile memory device (or chip) CP2 different from the first nonvolatile memory device CP1. In an example of FIG. 7A, the first direction DR1 may be a direction (e.g., a bottom-to-top (B2T) direction) from a lower portion (or a first edge) of the first memory block BLK1 corresponding to the smallest size of the first channel hole CH1 to an upper portion (or a second edge) of the first memory block BLK1 corresponding to the largest size of the first channel hole CH1. In addition, in an example of FIG. 7A, the second direction DR2 may be a direction (e.g., a top-to-bottom (T2B) direction) from an upper portion (or a second edge) of the second memory block BLK2 corresponding to the largest size of the second channel hole CH2 to a lower portion (or a first edge) of the second memory block BLK2 corresponding to the smallest size of the second channel hole CH2. For example, each of the channel holes CH1 and CH2 may correspond to the channel hole CHc of FIG. 6A.

After that, the first to N-th page pairs may be formed by setting the pages P1_1 and P2_1 as the first page pair, by setting the pages P1_2 and P2_2 as a second page pair, by setting the pages P1_(N−1) and P2_(N−1) as an (N−1)-th page pair, and by setting the pages P1_N and P2_N as the N-th page pair.

In some example embodiments, first to N-th page addresses A1_1, A1_2, . . . , A1_(N−1), A1_N may be sequentially allocated or assigned to the first to N-th pages P1_1 to P1_N, and (N+1)-th to 2N-th page addresses A2_1, A2_2, . . . , A2_(N−1), A2_N may be sequentially allocated or assigned to the (N+1)-th to 2N-th pages P2_1 to P2_N. For example, each of the page addresses A1_1 to A1_N and A2_1 to A2_N may represent a physical page number (PPN). For example, the first to N-th page addresses A1_1 to A1_N may be consecutive page addresses, and the (N+1)-th to 2N-th page addresses A2_1 to A2_N may be consecutive page addresses. For example, the first to N-th page addresses A1_1 to A1_N and the (N+1)-th to 2N-th page addresses A2_1 to A2_N may not be continued with each other.

In an example of FIG. 7A, two (or more) chips with page numbers (or addresses) in reverse directions may be implemented with a pair of chips, and then a page address scrambling may be performed such that two (or more) pages having the same page number (or address) while having opposite physical locations inside the chip (or memory block) are set as a pair of pages.

Figure 7B:
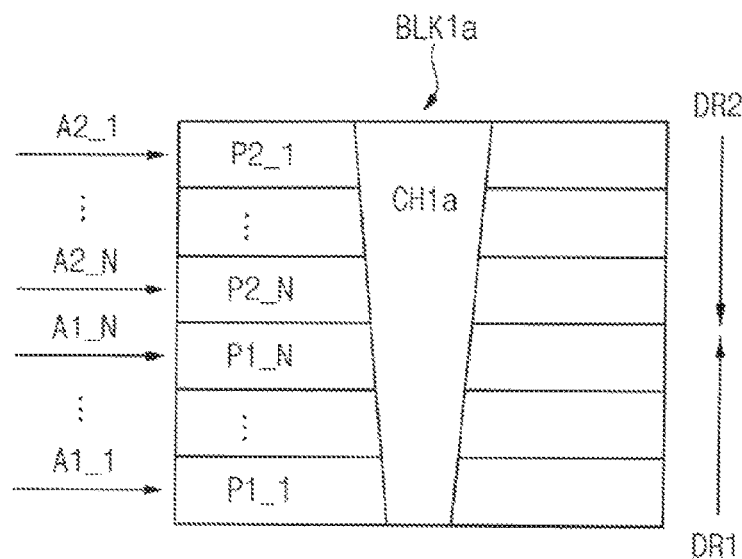

Referring to FIG. 7B, an example where two pages included in one page pair are included in the same memory block (e.g., an example where page pairs are implemented within one memory block) is illustrated.

For example, first to N-th pages P1_1, . . . , P1_N and (N+1)-th to 2N-th pages P2_1, . . . , P2_N may be included in a first memory block BLK1a, and may be sequentially arranged along a first channel hole CH1a included in the first memory block BLK1a. For example, the first to N-th pages P1_1 to P1_N may be sequentially arranged in a first direction DR1, and the (N+1)-th to 2N-th pages P2_1 to P2_N may be sequentially arranged in a second direction DR2. In an example of FIG. 7B, the first direction DR1 may be a direction from a lower portion (or a first edge) of the first memory block BLK1a corresponding to the smallest size of the first channel hole CH1a to a center or central portion of the first memory block BLK1a. In addition, in an example of FIG. 7B, the second direction DR2 may be a direction from an upper portion (or a second edge) of the first memory block BLK1a corresponding to the largest size of the first channel hole CH1a to the center or central portion of the first memory block BLK1a.

After that, the first to N-th page pairs may be formed by setting the pages P1_1 and P2_1 as the first page pair, and by setting the pages P1_N and P2_N as the N-th page pair. For example, both the first page P1_1 and the (N+1)-th page P2_1 included in the first page pair may be disposed at the edges of the first memory block BLK1a. In addition, page addresses A1_1, . . . , A1_N and page addresses A2_1, . . . , A2_N may be sequentially allocated to the pages P1_1 to P1_N and P2_1 to P2_N, respectively. For example, the page addresses A1_1 to A1_N and A2_1 to A2_N may be consecutive page addresses.

Figure 7C:
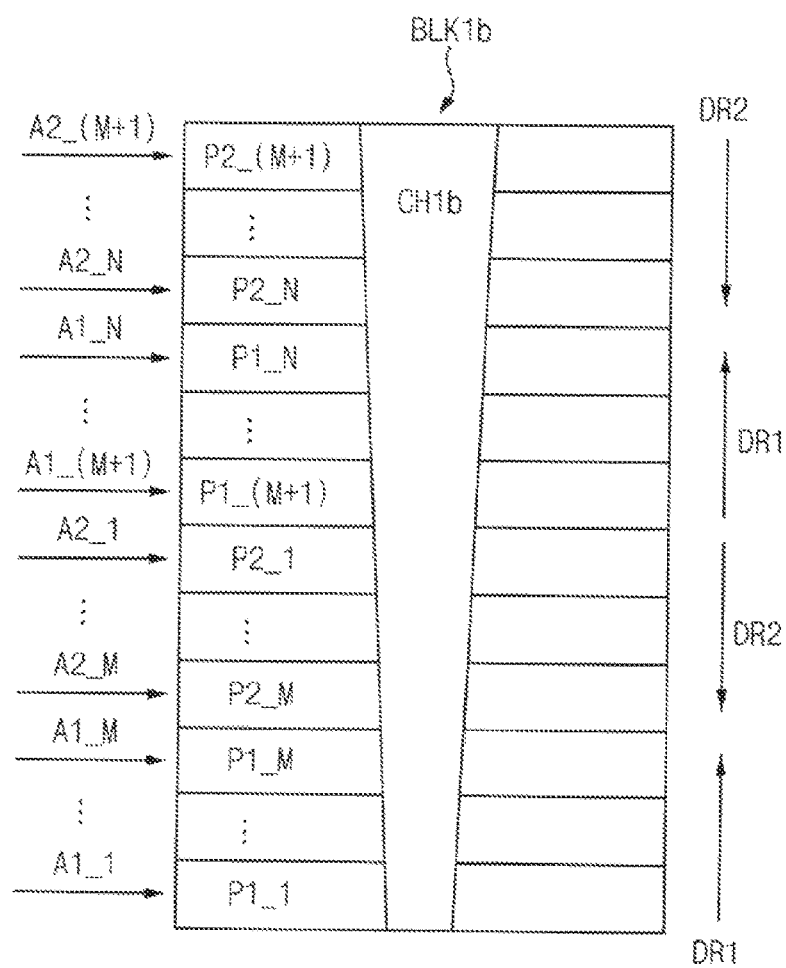

Referring to FIG. 7C, an example where two pages included in one page pair are included in the same memory block is illustrated.

For example, first to N-th pages P1_1, . . . , P1_M, P1_(M+1), . . . , P1_N and (N+1)-th to 2N-th pages P2_1, . . . , P2_M, P2_(M+1), . . . , P2_N may be included in a first memory block BLK1b, and may be sequentially arranged along a first channel hole CH1b included in the first memory block BLK1b. For example, the first to N-th pages P1_1 to P1_N may be sequentially arranged in a first direction DR1, and the (N+1)-th to 2N-th pages P2_1 to P2_N may be sequentially arranged in a second direction DR2. In an example of FIG. 7C, the first direction DR1 with respect to the first to M-th pages P1_1 to P1_M may be a direction from a lower portion (or a first edge) of the first memory block BLK1b corresponding to the smallest size of the first channel hole CH1b toward a center of the first memory block BLK1b, and the first direction DR1 with respect to the (M+1)-th to N-th pages P1_(M+1) to P1_N may be a direction from the center of the first memory block BLK1b toward an upper portion (or a second edge) of the first memory block BLK1b corresponding to the largest size of the first channel hole CH1b, where M is a natural number greater than or equal to two and less than N. In addition, in an example of FIG. 7C, the second direction DR2 with respect to the (N+1)-th to (N+M)-th pages P2_1 to P2_M may be a direction from the center of the first memory block BLK1b toward the lower portion of the first memory block BLK1b, and the second direction DR2 with respect to the (N+M+1)-th to 2N-th pages P2_(M+1) to P2_N may be a direction from the upper portion of the first memory block BLK1b toward the center of the first memory block BLK1b.

After that, the first to N-th page pairs may be formed by setting the pages P1_1 and P2_1 as the first page pair, by setting the pages P1_M and P2_M as an M-th page pair, by setting the pages P1_(M+1) and P2_(M+1) as an (M+1)-th page pair, and by setting the pages P1_N and P2_N as the N-th page pair. For example, the first page P1_1 included in the first page pair may be disposed at the edge of the first memory block BLK1b, and the (N+1)-th page P2_1 included in the first page pair may be disposed in the center of the first memory block BLK1b. In addition, page addresses A1_1, . . . , A1_M, A1_(M+1), . . . , A1_N and page addresses A2_1, . . . , A2_M, A2_(M+1), . . . , A2_N may be sequentially allocated to the pages P1_1 to P1_N and P2_1 to P2_N.

Figure 8A:
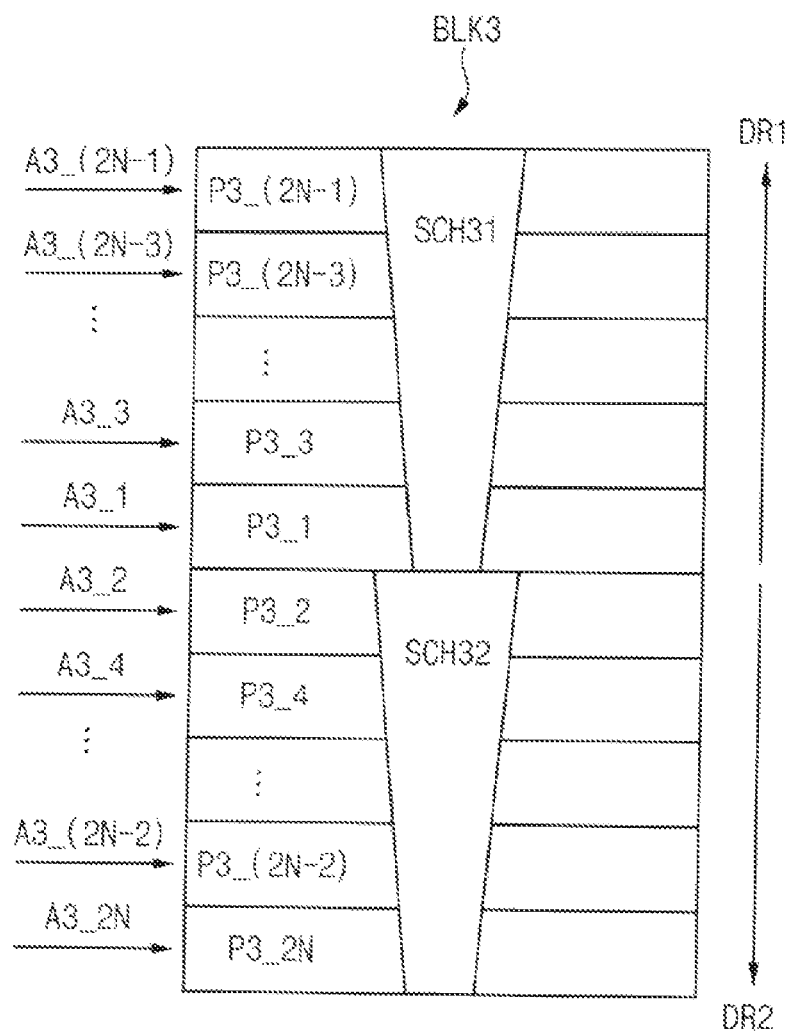

Referring to FIG. 8A, an example (e.g., a multi-stack structure) where two pages included in one page pair are included in the same memory block and one channel hole includes two sub-channel holes is illustrated.

For example, first to N-th pages P3_1, P3_3, . . . , P3_(2N−3), P3_(2N−1) and (N+1)-th to 2N-th pages P3_2, P3_4, . . . , P3_(2N−2), P3_2N may be included in a first memory block BLK3. The first memory block BLK3 may include a channel hole, and the channel hole may include a first sub-channel hole SCH31 and a second sub-channel hole SCH32. The first to N-th pages P3_1 to P3_(2N−1) may be sequentially arranged along the first sub-channel hole SCH31 and may be sequentially arranged in a first direction DR1. The (N+1)-th to 2N-th pages P3_2 to P3_2N may be sequentially arranged along the second sub-channel hole SCH32 and may be sequentially arranged in a second direction DR2. In an example of FIG. 8A, the first direction DR1 may be a direction from a center of the first memory block BLK3 to an upper portion of the first memory block BLK3, e.g., a direction from a portion corresponding to the smallest size of the first sub-channel hole SCH31 to a portion corresponding to the largest size of the first sub-channel hole SCH31. In addition, in an example of FIG. 8A, the second direction DR2 may be a direction from the center of the first memory block BLK3 to a lower portion of the first memory block BLK3, e.g., a direction from a portion corresponding to the largest size of the second sub-channel hole SCH32 to a portion corresponding to the smallest size of the second sub-channel hole SCH32. For example, the sub-channel holes SCH31 and SCH32 may respectively correspond to the sub-channel holes SCH1 and SCH2 of FIG. 6B.

After that, the first to N-th page pairs may be formed by setting the pages P3_1 and P3_2 as the first page pair, by setting the pages P3_3 and P3_4 as a second page pair, by setting the pages P3_(2N−3) and P3_(2N−2) as an (N−1)-th page pair, and by setting the pages P3_(2N−1) and P3_2N as the N-th page pair.

In some example embodiments, odd-numbered page addresses A3_1, A3_3, . . . , A3_(2N−3), A3_(2N−1) among first to 2N-th page addresses A3_1, A3_2, A3_3, A3_4, . . . , A3_(2N−3), A3_(2N−2), A3_(2N−1), A3_2N may be sequentially allocated to the first to N-th pages P3_1 to P3_(2N−1), and even-numbered page addresses A3_2, A3_4, . . . , A3_(2N−2), A3_2N among the first to 2N-th page addresses A3_1 to A3_2N may be sequentially allocated to the (N+1)-th to 2N-th pages P3_2 to P3_2N. For example, the first to 2N-th page addresses A3_1 to A3_2N may be consecutive page addresses.

In an example of FIG. 8A, page numbers (or addresses) may be alternately allocated in reverse directions starting from the center of the memory block BLK3 with a two-stacked structure, and then a page address scrambling may be performed such that pages having logically consecutive page numbers (or addresses) and having physically complementary structures are set as a pair of pages.

Figure 8B:
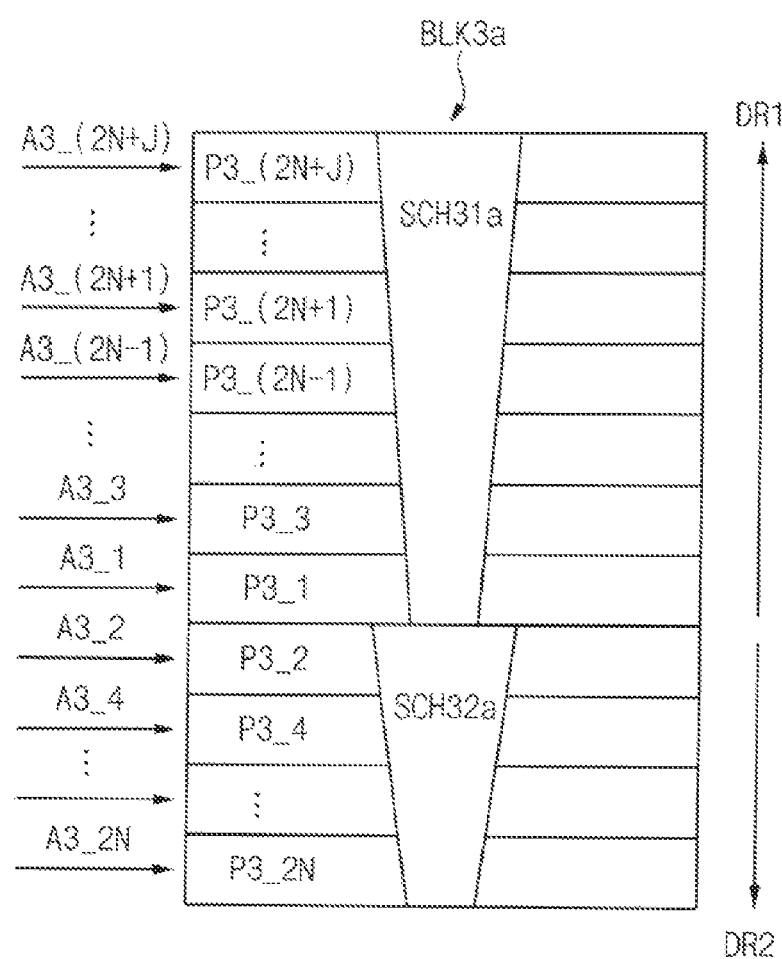

Referring to FIG. 8B, a multi-stack structure similar to an example of FIG. 8A is illustrated. The descriptions repeated with FIG. 8A will be omitted.

A memory block BLK3a of FIG. 8B may be substantially the same as the memory block BLK3 of FIG. 8A, except that memory block BLK3a further includes (2N+1)-th to (2N+J)-th pages P3_(2N+1), . . . , P3_(2N+J), where J is a natural number greater than or equal to two.

The (2N+1)-th to (2N+J)-th pages P3_(2N+1) to P3_(2N+J) may be sequentially arranged along the first sub-channel hole SCH31a and may be sequentially arranged in the first direction DR1, together with the first to N-th pages P3_1 to P3_(2N−1). In other words, in an example of FIG. 8B, the stacked number in an upper layer including the first sub-channel hole SCH31a and the stacked number in a lower layer including the second sub-channel hole SCH32a may be different from each other. As described above, in an example of FIG. 8A, the number of pages (or wordlines) P3_2 to P3_2N stacked along the second sub-channel hole SCH32 and the number of pages (or wordlines) P3_1 to P3_(2N−1) stacked along the first sub-channel hole SCH31 may be equal to N. In contrast, in an example of FIG. 8B, the number of pages (or wordlines) P3_2 to P3_2N stacked along the second sub-channel hole SCH32a and the number of pages (or wordlines) P3_1 to P3_(2N+J) stacked along the first sub-channel hole SCH31a may be different from each other and may be N and (N+J), respectively.

An operation of setting the first to N-th page pairs based on the first to N-th pages P3_1 to P3_(2N−1) and the (N+1)-th to 2N-th pages P3_2 to P3_2N, and an operation of allocating the page addresses A3_1 to A3_2N may be substantially the same as those described with reference to FIG. 8A.

In some example embodiments, the sizes of the channel hole corresponding to the (2N+1)-th to (2N+J)-th pages P3_(2N+1) to P3_(2N+J) may be greater than the size of the channel hole corresponding to the N-th page P3_(2N−1). In other words, the N page pairs may be set using the N pages (e.g., the first to N-th pages P3_1 to P3_(2N−1)) corresponding to relatively small sizes of the channel hole among (N+J)

pages, rather than the J pages (e.g., the (2N+1)-th to (2N+J)-th pages P3_(2N+1) to P3_(2N+J)) corresponding to relatively large sizes of the channel hole among (N+J) pages.

In some example embodiments, the (2N+1)-th to (2N+J)-th pages P3_(2N+1) to P3_(2N+J) corresponding to relatively large sizes of the channel hole may be driven without setting page pairs. In other example embodiments, the (2N+1)-th to (2N+J)-th pages P3_(2N+1) to P3_(2N+J) corresponding to relatively large sizes of the channel hole may be driven by setting page pairs by themselves. For example, the pages P3_(2N+1) and P3_(2N+J) may be set as one page pair, page addresses A3_(2N+1) and A3_(2N+J) may be allocated to the pages P3_(2N+1) and P3_(2N+J), and the page pair including the pages P3_(2N+1) and P3_(2N+J) may be driven.

Although FIG. 8B illustrates that the (2N+1)-th to (2N+J)-th pages P3_(2N+1) to P3_(2N+J) are sequentially arranged along the first sub-channel hole SCH31a together with the first to N-th pages P3_1 to P3_(2N−1), example embodiments are not limited thereto. For example, the (2N+1)-th to (2N+J)-th pages P3_(2N+1) to P3_(2N+J) a may be sequentially arranged along the second sub-channel hole SCH32a together with the (N+1)-th to 2N-th pages P3_2 to P3_2N.

Figure 8C:
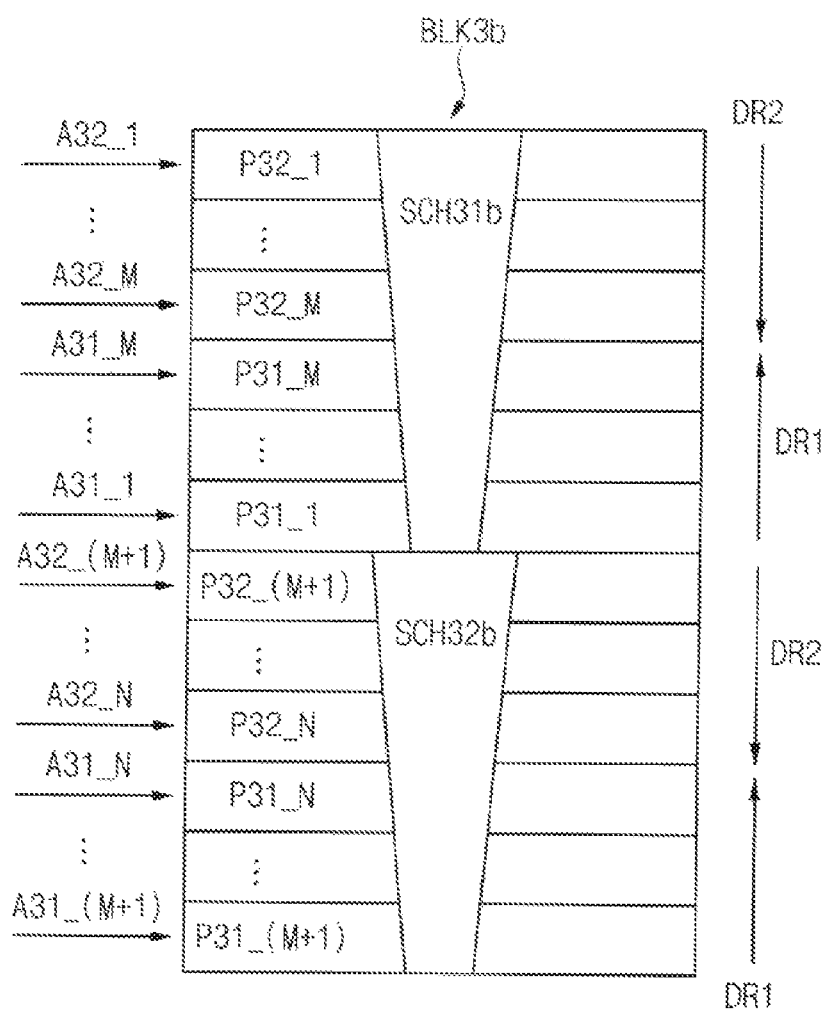

Referring to FIG. 8C, an example where one channel hole included in one memory block includes two sub-channel holes and two pages included in one page pair are included in the same memory block and correspond to one sub-channel hole is illustrated.

For example, first to N-th pages P31_1, . . . , P31_M, P31_(M+1), . . . , P31_N and (N+1)-th to 2N-th pages P32_1, . . . , P32_M, P32_(M+1), . . . , P32_N may be included in a first memory block BLK3b. The first memory block BLK3b may include a channel hole, and the channel hole may include a first sub-channel hole SCH31b and a second sub-channel hole SCH32b. The first to M-th pages P31_1 to P31_M among the first to N-th pages P31_1 to P31_N may be sequentially arranged along the first sub-channel hole SCH31b and may be sequentially arranged in a first direction DR1. The (N+1)-th to (N+M)-th pages P32_1 to P32_M among the (N+1)-th to 2N-th pages P32_1 to P32_N may be sequentially arranged along the first sub-channel hole SCH31b and may be sequentially arranged in a second direction DR2. The (M+1)-th to N-th pages P31_(M+1) to P31_N among the first to N-th pages P31_1 to P31_N may be sequentially arranged along the second sub-channel hole SCH32b and may be sequentially arranged in the first direction DR1. The (N+M+1)-th to 2N-th pages P32_(M+1) to P32_N among the (N+1)-th to 2N-th pages P32_1 to P32_N may be sequentially arranged along the second sub-channel hole SCH32b and may be sequentially arranged in the second direction DR2. In an example of FIG. 8C, the first direction DR1 may be a direction from first portions of the first memory block BLK3b corresponding to the smallest sizes of the sub-channel holes SCH31b and SCH32b toward second portions of the first memory block BLK3b corresponding to the largest sizes of the sub-channel holes SCH31b and SCH32b. In addition, in an example of FIG. 8C, the second direction DR2 may be a direction from the second portions of the first memory block BLK3b corresponding to the largest sizes of the sub-channel holes SCH31b and SCH32b toward the first portions of the first memory block BLK3b corresponding to the smallest sizes of the sub-channel holes SCH31b and SCH32b.

After that, the first to N-th page pairs may be formed by setting the pages P31_1 and P32_1 as the first page pair, by setting the pages P31_M and P32_M as an M-th page pair, by setting the pages P31_(M+1) and P32_(M+1) as an (M+1)-th page pair, and by setting the pages P31_N and P32_N as the N-th page pair. As with that described with reference to FIG. 7B, both the first page P31_1 and the (N+1)-th page P32_1 included in the first page pair may be disposed at the edges of the first sub-channel hole SCH31b. In addition, page addresses A31_1, . . . , A31_M, A31_(M+1), . . . , A31_N and page addresses A32_1, . . . , A32_M, A32_(M+1), . . . , A32_N may be sequentially allocated to the pages P31_1 to P31_N and P32_1 to P32_N.

In some example embodiments, although not illustrated in detail, an example of FIG. 7C may be applied or employed to a multi-stack structure described with reference to FIGS. 8A, 8B and 8C. For example, a page (e.g., the first page P31_1) disposed at an edge of a sub-channel hole (e.g., the first sub-channel hole SCH31b) and a page (e.g., the M-th page P31_M) disposed at a center of the sub-channel hole (e.g., the first sub-channel hole SCH31b) may be set as one page pair.

Figure 9:
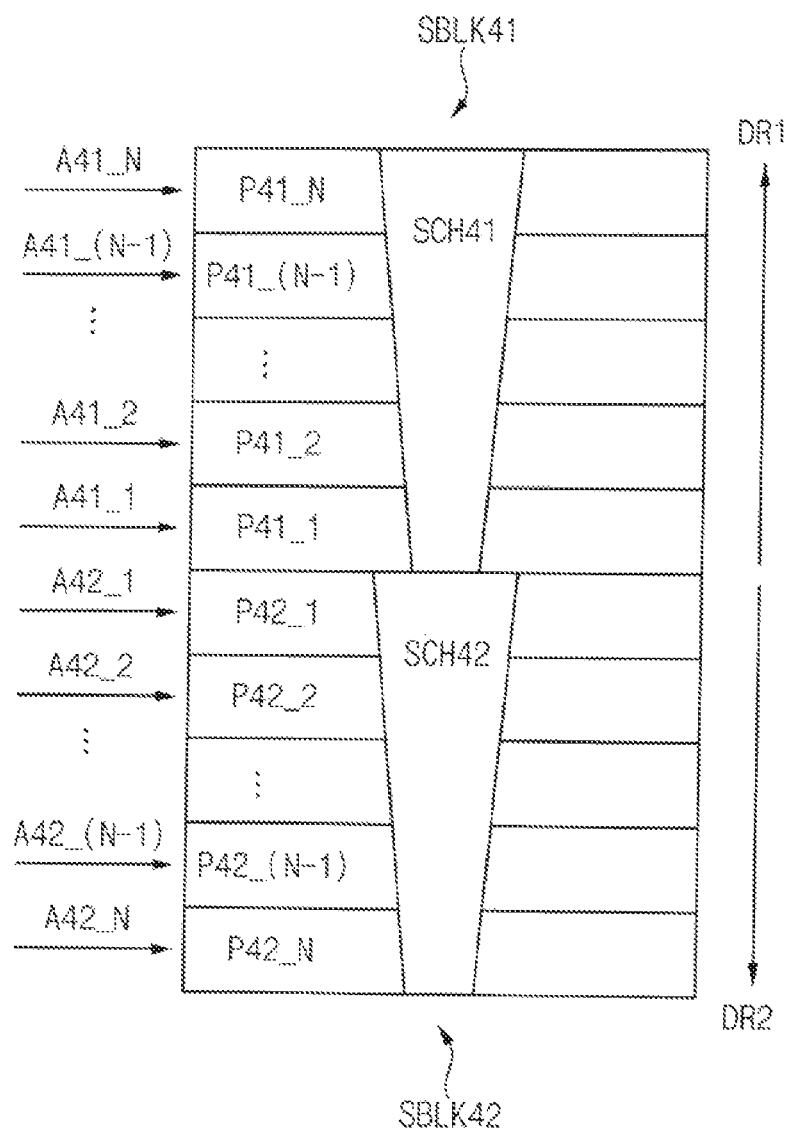

Referring to FIG. 9, an example where two pages included in one page pair are included in the same memory block and different sub-blocks and one channel hole includes two sub-channel holes is illustrated.

For example, first to N-th pages P41_1, P41_2, . . . , P41_(N−1), P41_N may be included in a first sub-block SBLK41, and (N+1)-th to 2N-th pages P42_1, P42_2, . . . , P42_(N−1), P42_N may be included in a second sub-block SBLK42 different from the first sub-block SBLK41. The first to N-th pages P41_1 to P41_N may be sequentially arranged along a first sub-channel hole SCH41 included in the first sub-block SBLK41 and may be sequentially arranged in a first direction DR1. The (N+1)-th to 2N-th pages P42_1 to P42_N may be sequentially arranged along a second sub-channel hole SCH42 included in the second sub-block SBLK42 and may be sequentially arranged in a second direction DR2. The first and second sub-blocks SBLK41 and SBLK42 may be included in one memory block included in one nonvolatile memory device, and may be independently programmed and erased.

After that, the first to N-th page pairs may be formed by setting the pages P41_1 and P42_1 as the first page pair, by setting the pages P41_2 and P42_2 as a second page pair, by setting the pages P41_(N−1) and P42_(N−1) as an (N−1)-th page pair, and by setting the pages P41_N and P42_N as the N-th page pair.

In some example embodiments, first to N-th page addresses A41_1, A41_2, . . . , A41_(N−1), A41_N may be sequentially allocated to the first to N-th pages P41_1 to P41_N, and (N+1)-th to 2N-th page addresses A42_1, A42_2, . . . , A42_(N−1), A42_N may be sequentially allocated to the (N+1)-th to 2N-th pages P42_1 to P42_N. The page addresses A41_1 to A41_N and A42_1 to A42_N in FIG. 9 may be similar to the page addresses A1_1 to A1_N and A2_1 to A2_N in FIG. 7A.

Figure 10:
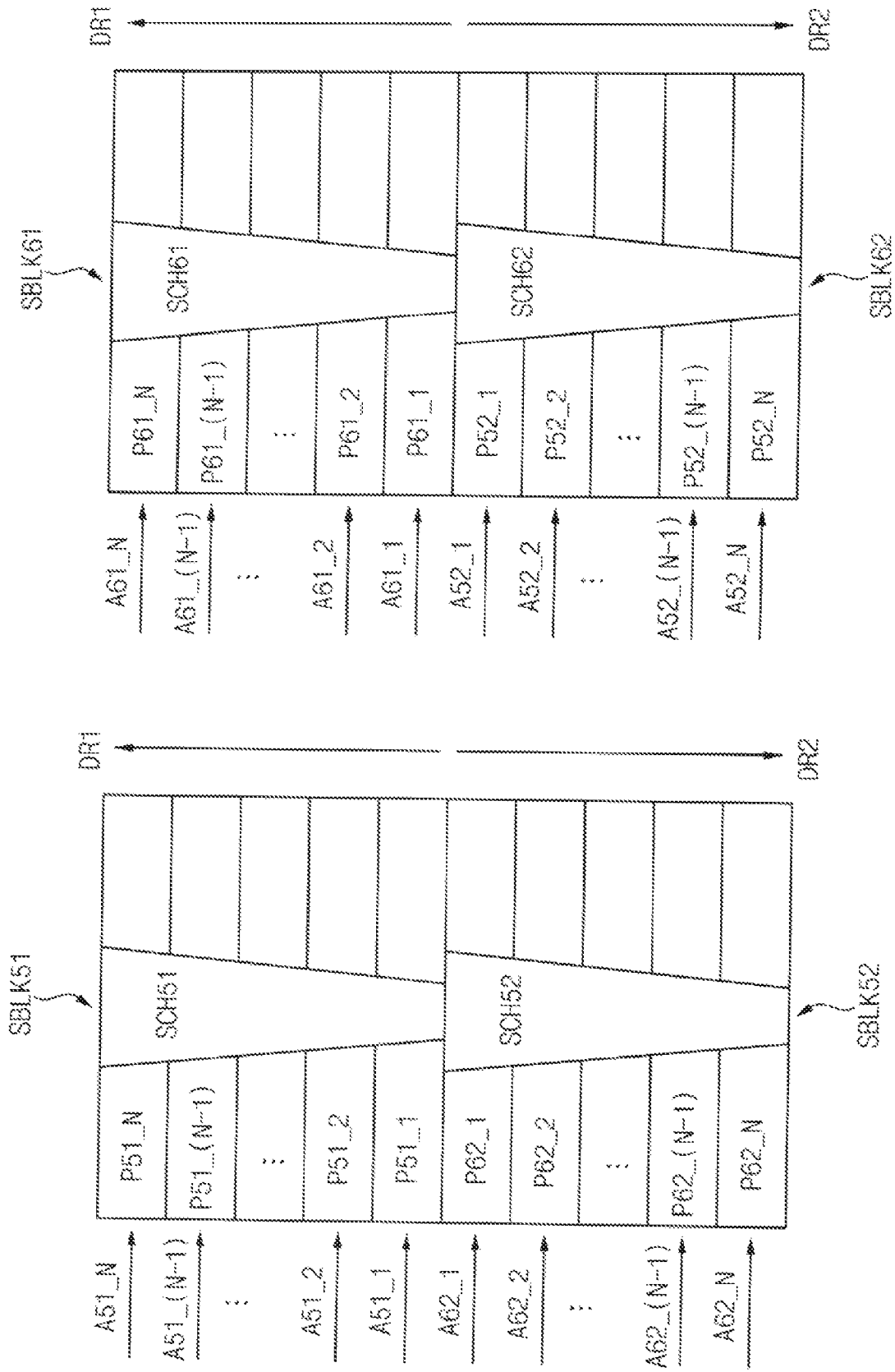

Referring to FIG. 10, an example where two pages included in one page pair are included in different memory blocks and different sub-blocks and one channel hole includes two sub-channel holes is illustrated.

For example, first to N-th pages P51_1, P51_2, . . . , P51_(N−1), P51_N may be included in a first sub-block SBLK51, pages P62_1, P62_2, . . . , P62_(N−1), P62_N may be included in a second sub-block SBLK52, pages P61_1, P61_2, . . . , P61_(N−1), P61_N may be included in a third sub-block SBLK61, and (N+1)-th to 2N-th pages P52_1, P52_2, . . . , P52_(N−1), P52_N may be included in a fourth sub-block SBLK62. The first to N-th pages P51_1 to P51_N may be sequentially arranged along a first sub-channel hole SCH51 included in the first sub-block SBLK51 and may be sequentially arranged in a first direction DR1. The pages P62_1 to P62_N may be sequentially arranged along a second sub-channel hole SCH52 included in the second sub-block SBLK52 and may be sequentially arranged in a second direction DR2. The pages P61_1 to P61_N may be sequentially arranged along a third sub-channel hole SCH61 included in the third sub-block SBLK61 and may be sequentially arranged in the first direction DR1. The (N+1)-th to 2N-th pages P52_1 to P52_N may be sequentially arranged along a fourth sub-channel hole SCH62 included in the fourth sub-block SBLK62 and may be sequentially arranged in the second direction DR2. The first and second sub-blocks SBLK51 and SBLK52 may be included in a first memory block, and the third and fourth sub-blocks SBLK61 and SBLK62 may be included in a second memory block different from the first memory block. The first, second, third and fourth sub-blocks SBLK51, SBLK52, SBLK61 and SBLK62 may be independently programmed and erased.

After that, the first to N-th page pairs may be formed by setting the pages P51_1 and P52_1 as the first page pair, by setting the pages P51_2 and P52_2 as a second page pair, by setting the pages P51_(N−1) and P52_(N−1) as an (N−1)-th page pair, and by setting the pages P51_N and P52_N as the N-th page pair.

In some example embodiments, first to N-th page addresses A51_1, A51_2, . . . , A51_(N−1), A51_N may be sequentially allocated to the first to N-th pages P51_1 to P51_N, and (N+1)-th to 2N-th page addresses A52_1, A52_2, . . . , A52_(N−1), A52_N may be sequentially allocated to the (N+1)-th to 2N-th pages P52_1 to P52_N. The page addresses A51_1 to A51_N and A52_1 to A52_N in FIG. 10 may be similar to the page addresses A1_1 to A1_N and A2_1 to A2_N in FIG. 7A.

Similarly, page pairs may be set using the pages P61_1 to P61_N and the pages P62_1 to P62_N, and page addresses A61_1, A61_2, . . . , A61_(N−1), A61_N and A62_1, A62_2, . . . , A62_(N−1), A62_N may be sequentially allocated to the pages P61_1 to P61_N and P62_1 to P62_N.

In examples of FIGS. 9 and 10, a memory block with a two-stacked structure may be divided into two sub-blocks with respect to the center of the memory block, and then a page address scrambling may be performed such that pages having the same page number (or address) while having opposite physical locations inside the sub-block are set as a pair of pages. For example, as illustrated in FIG. 9, the sub-blocks included in one memory block (e.g., the sub-blocks sharing the channel hole) may be used. For another example, as illustrated in FIG. 10, the sub-blocks included in different memory blocks (e.g., the sub-blocks that do not share the channel hole) may be used.

Figure 11:
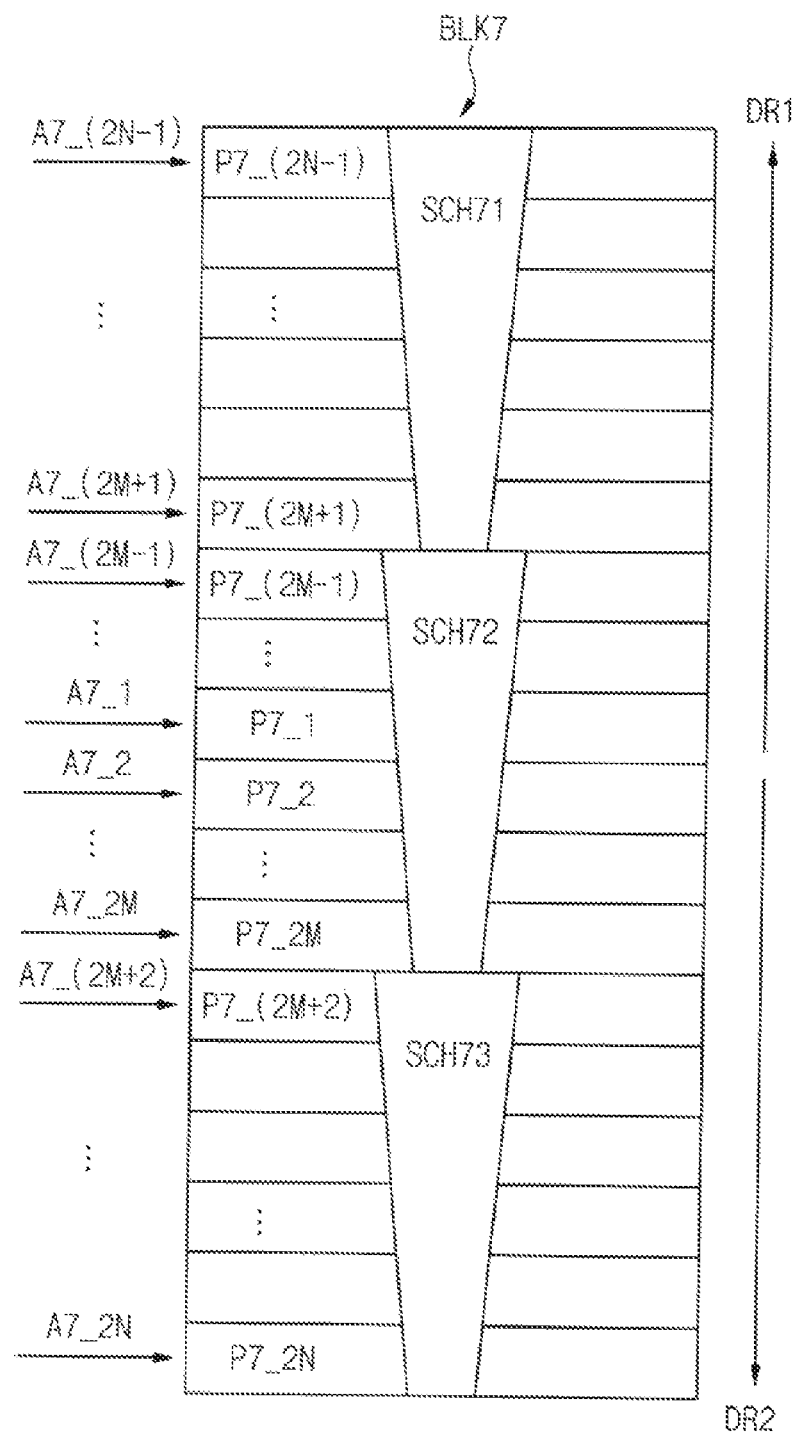

Referring to FIG. 11, an example where two pages included in one page pair are included in the same memory block and one channel hole includes three sub-channel holes is illustrated.

For example, first to N-th pages P7_1, . . . , P7_(2M−1), P7_(2M+1), . . . , P7_(2N−1) and (N+1)-th to 2N-th pages P7_2, . . . , P7_2M, P7_(2M+2), . . . , P7_2N may be included in a first memory block BLK7. The memory block BLK7 may include a channel hole, and the channel hole may include a first sub-channel hole SCH71, a second sub-channel hole SCH72 and a third sub-channel hole SCH73. The first to N-th pages P7_1 to P7_(2N−1) may be sequentially arranged along the first sub-channel hole SCH71 and a portion of the second sub-channel hole SCH72 and may be sequentially arranged in a first direction DR1. The (N+1)-th to 2N-th pages P7_2 to P7_2N may be sequentially disposed along the other portion of the second sub-channel hole SCH72 and the third sub-channel hole SCH73 and may be sequentially arranged in a second direction DR2.

After that, the first to N-th page pairs may be formed by setting the pages P7_1 and P7_2 as the first page pair, by setting the pages P7_(2M−1) and P7_2M as an M-th page pair, by setting the pages P7_(2M+1), P7_(2M+2) as an (M+1)-th page pair, and by setting the pages P7_(2N−1) and P7_2N as the N-th page pair.

In some example embodiments, odd-numbered page addresses A7_1, . . . , A7_(2M−1), A7_(2M+1), . . . , A7_(2N−1) may be sequentially allocated to the first to N-th pages P7_1 to P7_(2N−1), and even-numbered page addresses A7_2, . . . , A7_2M, A7_(2M+2), . . . , A7_2N may be sequentially allocated to (N+1)-th to 2N-th pages P7_2 to P7_2N. For example, the page addresses A7_1 to A7_2N in FIG. 11 may be similar to the page addresses A3_1 to A3_2N in FIG. 8A.

As described with reference to FIG. 11, page numbers (or addresses) may be alternately allocated in reverse directions starting from the center of the memory block BLK7 with a three-stacked structure (or more than three-stacked structure).

In some example embodiments, although not illustrated in detail, an example of FIG. 8B where the stacked numbers in different layer including different sub-channel holes are different from each other, an example of FIG. 8C where the pages disposed at the edges of one sub-channel hole are set as one page pair, and/or an example where the page disposed at the edge of the sub-channel hole and the page disposed at the center of the sub-channel hole are set as one page pair may be applied or employed to each of examples of FIGS. 9, 10 and 11.

Figure 12:
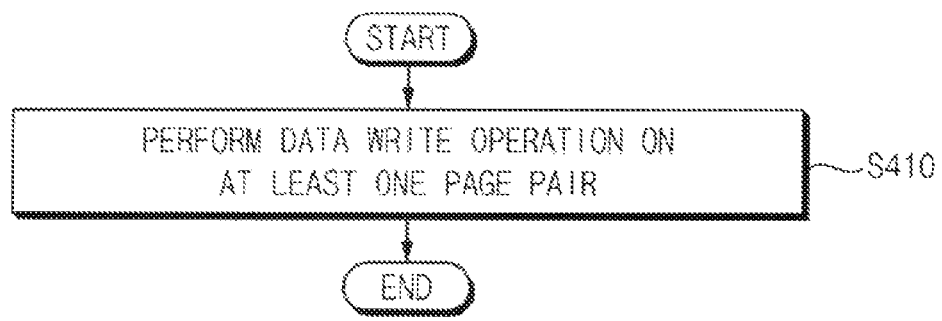
FIG. 12 is a flowchart illustrating an example of driving first to N-th page pairs in FIG. 1.

FIG. 12 is a flowchart illustrating an example of driving first to N-th page pairs in FIG. 1.

Referring to FIGS. 1 and 12, in step S400, a data write operation may be performed on at least one page pair (step S410). For example, a size of parity data and a scheme of the data write operation may vary depending on a position or location of the page pair, which will be described later.

Figure 13:
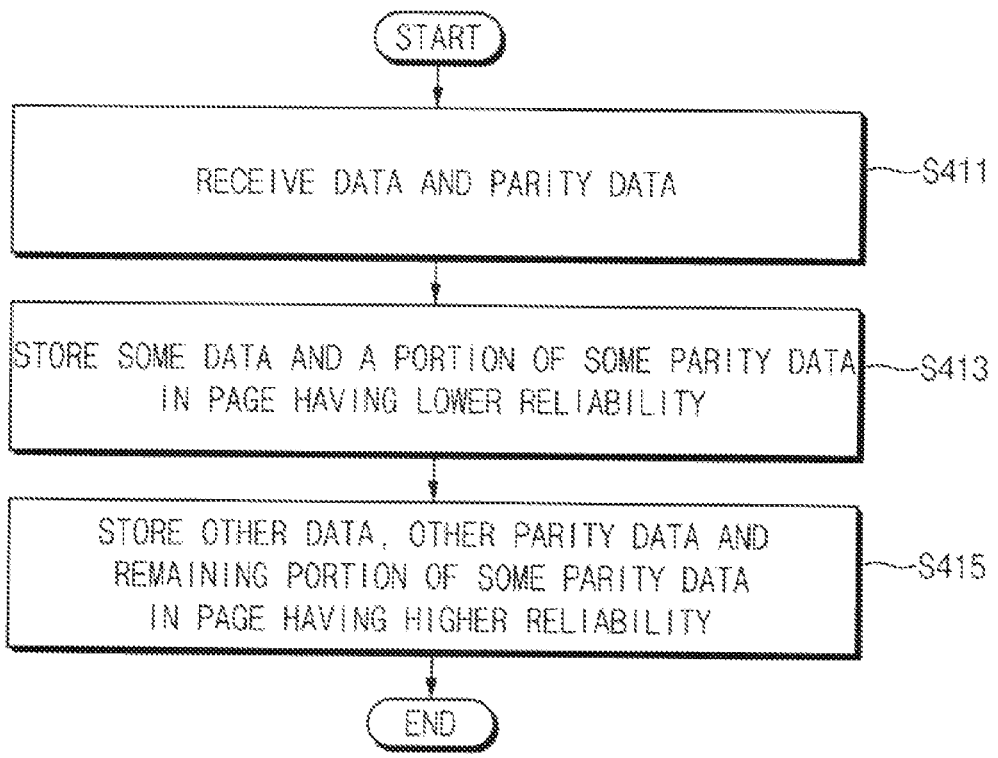
FIGS. 13 and 14 are flowcharts illustrating examples of performing a data write operation in FIG. 12.
Figure 14:
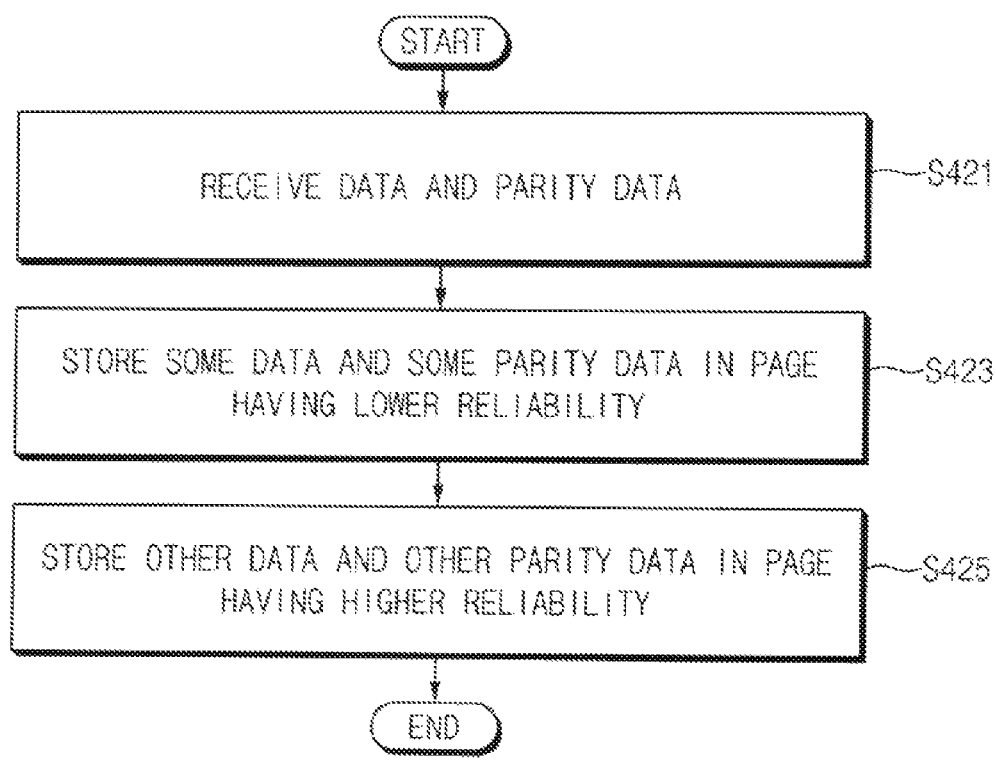

FIGS. 13 and 14 are flowcharts illustrating examples of performing a data write operation in FIG. 12.

Referring to FIGS. 12 and 13 in step S410, an example where a data write operation is performed on a page pair disposed at a relatively edge of a channel hole or a relatively edge of a sub-channel hole is illustrated.

For example, data to be stored in two pages included in a specific one page pair and parity data associated with or related to the data may be received (step S411). For example, a write command and a write address may be received together with the data and the parity data.

In some example embodiments, sizes (e.g., number of bits) of the parity data received in step S411 may be different from each other. For example, among the two pages included in the one page pair, a size of parity data corresponding to a page having relatively low reliability (e.g., a page with a relatively small channel hole size) may be larger than a size of parity data corresponding to a page having relatively high reliability (e.g., a page with a relatively large channel hole size).

In some example embodiments, the sizes of the parity data may vary depending on the position of the page pair, which will be described later.

Some of the data and a portion of some of the parity data corresponding to the some of the data may be stored in the page having relatively low reliability (step S413). The others of the data, the others of the parity data corresponding to the others of the data, and a remaining portion of the some of the parity data corresponding to the some of the data may be stored in the page having relatively high reliability (step S415). In other words, a parity region included in the page having relatively high reliability may be shared by the two pages included in the one page pair.

Referring to FIGS. 12 and 14 in step S410, an example where a data write operation is performed on a page pair disposed at a relatively center of a channel hole or a relatively center of a sub-channel hole is illustrated.

For example, data to be stored in two pages included in a specific one page pair and parity data associated with the data may be received (step S421). Step S421 in FIG. 14 may be similar to step S411 in FIG. 13.

In some example embodiments, sizes of the parity data received in step S421 may be substantially the same as each other.

Some of the data and some of the parity data corresponding to the some of the data may be stored in the page having relatively low reliability (step S423). The others of the data and the others of the parity data corresponding to the others of the data may be stored in the page having relatively high reliability (step S425). In other words, the two pages included in the page pair disposed at relatively center of the channel hole or the sub-channel hole may have little difference in channel hole size (e.g., little reliability difference), and thus parity regions included in the two pages may not be shared by the two pages included in the one page pair.

FIGS. 15, 16, 17 and 18 are diagrams for describing operations of FIGS. 13 and 14.

Figure 15:
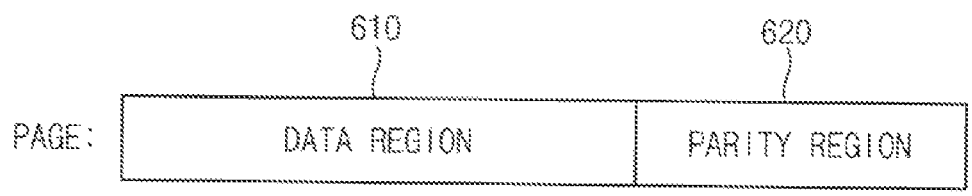
FIGS. 15, 16, 17 and 18 are diagrams for describing operations of FIGS. 13 and 14.

Referring to FIG. 15, each page may include a data region 610 in which data is stored and a parity region 620 in which parity data associated with the data is stored. For example, all of pages may include the data region 610 having the same size and the parity region 620 having the same size. For example, the data stored in the data region 610 may be actual data such as user data, and the parity data stored in the parity region 620 may be obtained by performing error correction code (ECC) encoding on the data. For example, a memory controller (e.g., the memory controller 600 in FIG. 22) may generate the parity data by performing the ECC encoding on the data.

Figure 16:
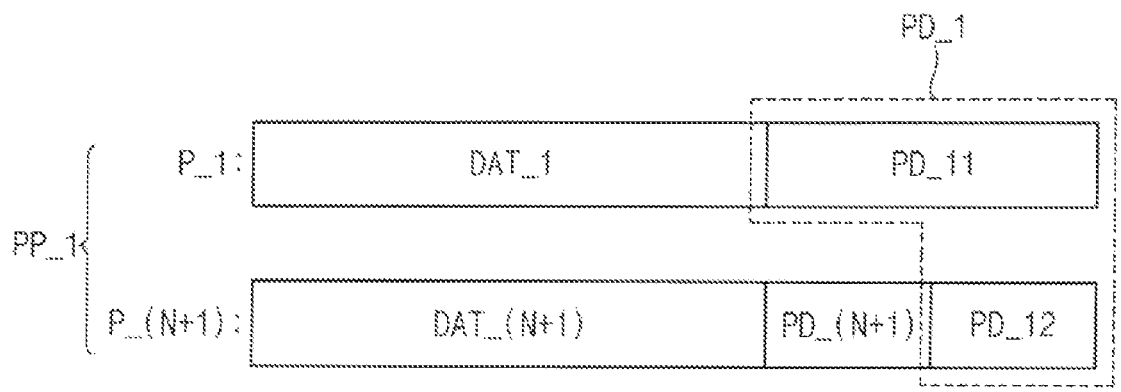

Referring to FIGS. 13 and 16, a data write operation may be performed on a first page pair PP_1 including a first page P_1 and an (N+1)-th page P_(N+1), and the first page P_1 and the (N+1)-th page P_(N+1) may be disposed at the outermost of the channel hole or the sub-channel hole. For example, the first page P_1 may be a page with the smallest channel hole size (e.g., a page having the lowest reliability) such as the first page P1_1 in FIG. 7A, and the (N+1)-th page P_(N+1) may be a page with the largest channel hole size (e.g., a page having the highest reliability) such as the (N+1)-th page P2_1 in FIG. 7A.

In step S411, first data DAT_1 to be stored in the first page P_1, second data DAT_(N+1) to be stored in the (N+1)-th page P_(N+1), first parity data PD_1 associated with the first data DAT_1, and second parity data PD_(N+1) associated with the second data DAT_(N+1) may be received. In step S413, the first data DAT_1 and a portion PD_11 of the first parity data PD_1 may be stored in the first page P_1. In step S415, the second data DAT_(N+1), the second parity data PD_(N+1), and a remaining portion PD_12 of the first parity data PD_1 may be stored in the (N+1)-th page P_(N+1).

In some example embodiments, a size of the first parity data PD_1 including the portions PD_11 and PD_12 may be larger than a size of the second parity data PD_(N+1).

Figure 17:
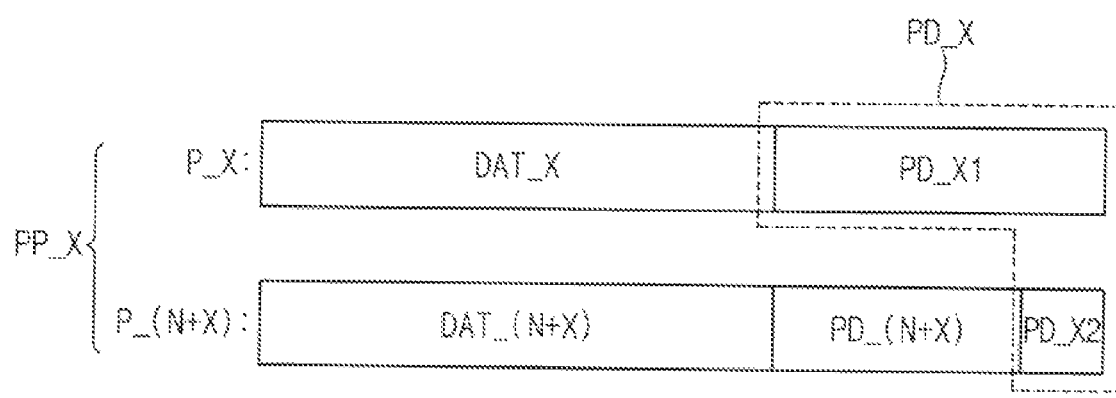

Referring to FIGS. 13 and 17, a data write operation may be performed on an X-th page pair PP_X including an X-th page P_X and an (N+X)-th page P_(N+X), where X is a natural number greater than or equal to two and less than or equal to N/2, and the X-th page P_X and the (N+X)-th page P_(N+X) may be disposed closer to the center of the channel hole or the sub-channel hole than the first page P_1 and the (N+1)-th page P_(N+1). For example, the X-th page P_X may correspond to a smaller channel hole size than the (N+X)-th page P_(N+X), e.g., the X-th page P_X may have lower reliability than the (N+X)-th page P_(N+X).

In step S411, third data DAT_X to be stored in the X-th page P_X, fourth data DAT_(N+X) to be stored in the (N+X)-th page P_(N+X), third parity data PD_X associated with the third data DAT_X, and fourth parity data PD_(N+X) associated with the fourth data DAT_(N+X) may be received. In step S413, the third data DAT_X and a portion PD_X1 of the third parity data PD_X may be stored in the X-th page P_X. In step S415, the fourth data DAT_(N+X), the fourth parity data PD_(N+X), and a remaining portion PD_X2 of the third parity data PD_X may be stored in the (N+X)-th page P_(N+X).

In some example embodiments, a size of the third parity data PD_X including the portions PD_X1 and PD_X2 may be larger than a size of the fourth data DAT_(N+X).

In some example embodiments, the size of the first parity data PD_1 in FIG. 16 and the size of the third parity data PD_X in FIG. 17 may be different from each other, and the size of the second parity data PD_(N+1) in FIG. 16 and the size of the fourth parity data PD_(N+X) in FIG. 17 may be different from each other. In addition, the size of the remaining portion PD_12 of the first parity data PD_1 stored in the (N+1)-th page P_(N+1) in FIG. 16 and the size of the remaining portion PD_X2 of the third parity data PD_X stored in the (N+X)-th page P_(N+X) in FIG. 17 may be different from each other. For example, the size of the first parity data PD_1 may be larger than the size of the third data DAT_X, the size of the second parity data PD_(N+1) may be smaller than the size of the fourth parity data PD_(N+X), and the size of the remaining portion PD_12 of the first parity data PD_1 may be larger than the size of the remaining portion PD_X2 of the third parity data PD_X. In other words, as the position of the page is closer to the outermost of the channel hole or the sub-channel hole, the size of the parity data may become large, and thus the size of the parity data stored in another page of the page pair may also become large.

Figure 18:
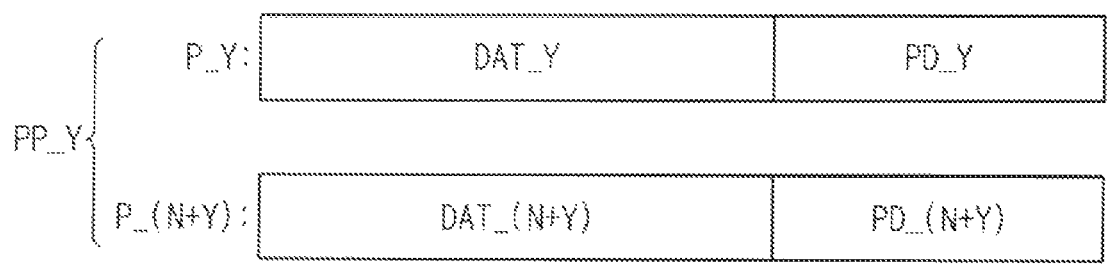

Referring to FIGS. 14 and 18, a data write operation may be performed on a Y-th page pair PP_Y including a Y-th page P_Y and an (N+Y)-th page P_(N+Y), where Y is a natural number closest to N/2, and the Y-th page P_Y and the (N+Y)-th page P_(N+Y) may be disposed closest to the center of the channel hole or the sub-channel hole.

In step S421, fifth data DAT_Y to be stored in the Y-th page P_Y, sixth data DAT_(N+Y) to be stored in the (N+Y)-th page P_(N+Y), fifth parity data PD_Y associated with the fifth data DAT_Y and the sixth parity data PD_(N+Y) associated with the sixth data DAT_(N+Y) may be received. In step S423, the fifth data DAT_Y and the fifth parity data PD_Y may be stored in the Y-th page P_Y. In step S425, the sixth data DAT_(N+Y) and the sixth parity data PD_(N+Y) may be stored in the (N+Y)-th page P_(N+Y).

In some example embodiments, a size of the fifth parity data PD_Y may be substantially the same as a size of the sixth parity data PD_(N+Y).

As described above, parity data corresponding to one page may be divided into two portions and a portion of the parity data may be stored in another page, according to example embodiments. In addition, the size or amount of the divided parity data may be different for each page (or wordline) depending on a position of each page, and the parity data may not be divided for some pages.

Figure 19:
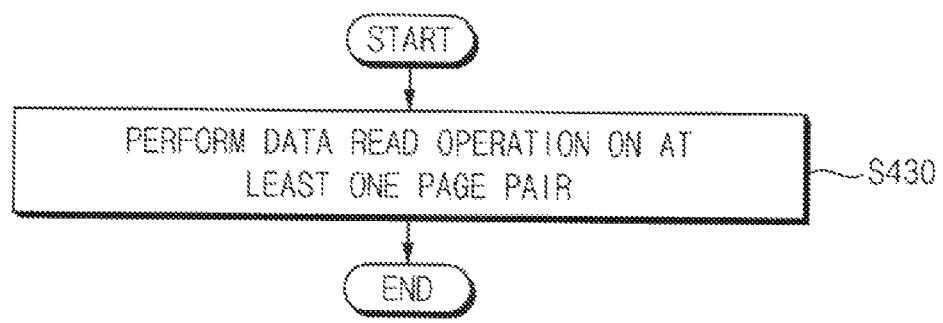
FIG. 19 is a flowchart illustrating an example of driving first to N-th page pairs in FIG. 1.

FIG. 19 is a flowchart illustrating an example of driving first to N-th page pairs in FIG. 1.

Referring to FIGS. 1 and 19, in step S400, a data read operation may be performed on at least one page pair (step S430). For example, a scheme of the data read operation may vary depending on a position or location of the page pair, which will be described later.

Figure 20:
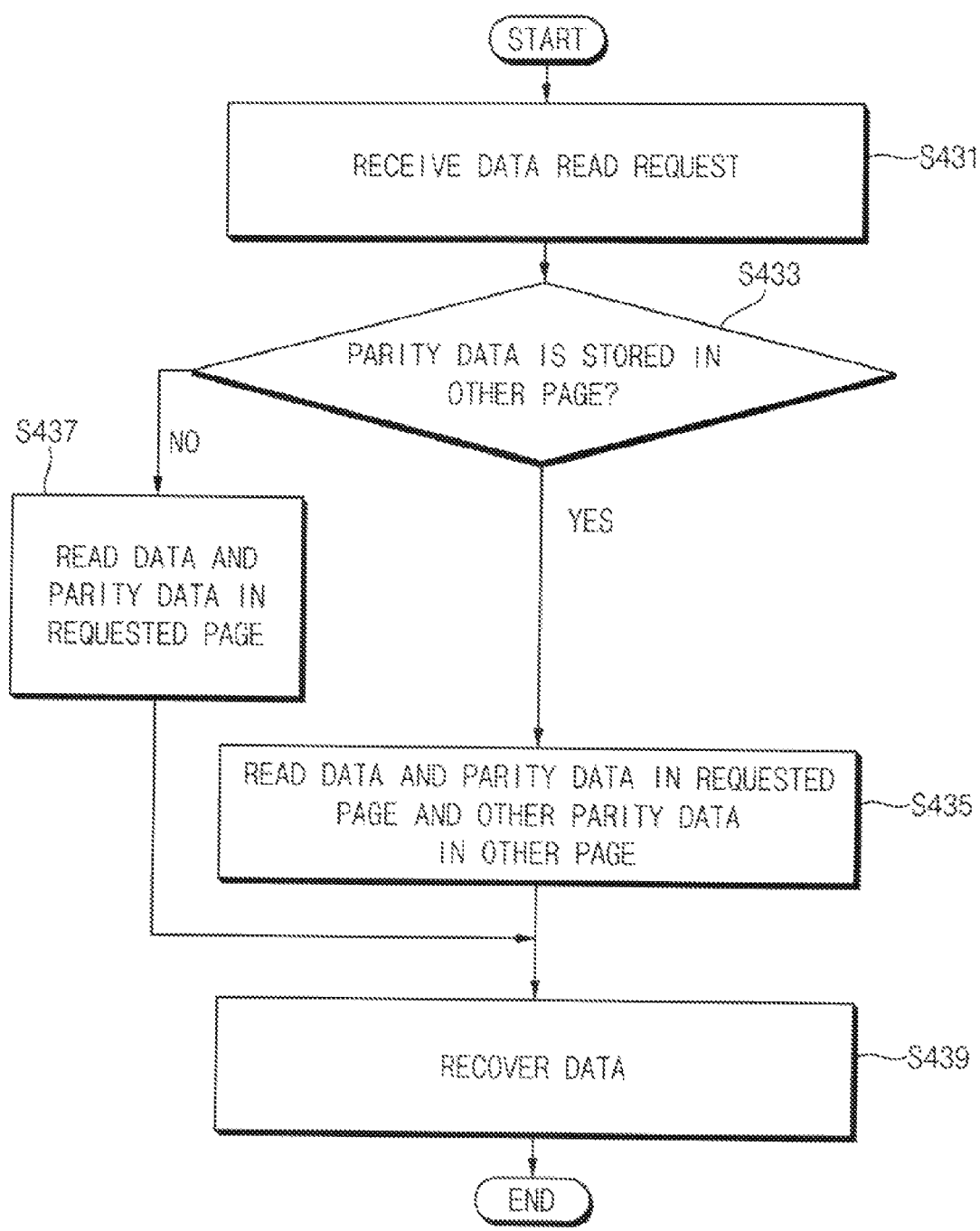
FIGS. 20 and 21 are flowcharts illustrating examples of performing a data read operation in FIG. 19.
Figure 21:
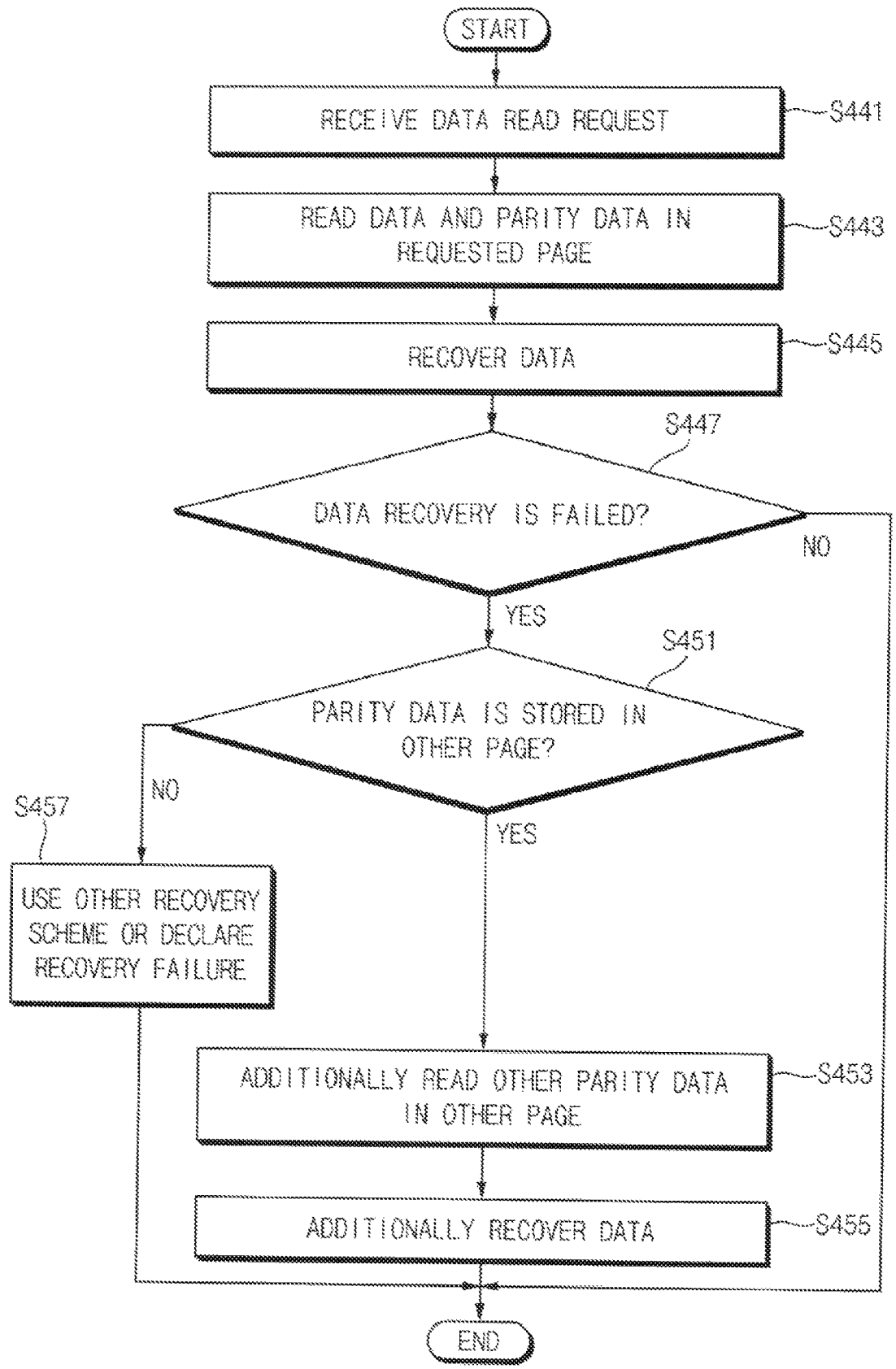

FIGS. 20 and 21 are flowcharts illustrating examples of performing a data read operation in FIG. 19.

Referring to FIGS. 19 and 20, in step S430, a data read request for a specific page may be received (step S431). For example, a read command and a read address may be received.

It may be checked whether at least a portion of parity data associated with data to be read corresponding to the data read request is stored in another page (step S433). For example, step S433 may be performed based on a page address included in the read address and/or a page pair mapping table (e.g., the page pair mapping table 162 in FIG. 2).

When the at least a portion of the parity data is stored in the another page (step S433: YES), the data and the parity data stored in the page corresponding to the data read request may be read or retrieved and the parity data stored in the another page may be read or retrieved (step S435). For example, when the first data DAT_1 in FIG. 16 is to be read, the first data DAT_1 and the portion PD_11 of the first parity data PD_1 stored in the first page P_1 may be read and the remaining portion PD_12 of the first parity data PD_1 stored in the (N+1)-th page P_(N+1) may be read. For example, the first page P_1 and the (N+1)-th page P_(N+1) may be sequentially read or substantially simultaneously read. For example, the (N+1)-th page P_(N+1) may be entirely read or only the parity region in the (N+1)-th page P_(N+1) may be read.

When the at least a portion of the parity data is not stored in the another page (step S433: NO), the data and the parity data stored in the page corresponding to the data read request may be read or retrieved (step S437). For example, when the second data DAT_(N+1) in FIG. 16 is to be read, the second data DAT_(N+1) and the second parity data PD_(N+1) stored in the (N+1)-th page P_(N+1) may be read.

Based on the parity data read in step S435 or S437, the read data may be recovered (or restored) and output (step S439). For example, when step S435 is performed to read the first data DAT_1, the portion PD_11 of the first parity data PD_1, and the remaining portion PD_12 of the first parity data PD_1, the first data DAT_1 may be recovered based on all of the first parity data PD_1. For example, when step S437 is performed to read the second data DAT_(N+1) and the second parity data PD_(N+1), the second data DAT_(N+1) may be recovered based on the second parity data PD_(N+1). For example, a memory controller (e.g., the memory controller 600 in FIG. 22) may perform the above-described data recovery operation by performing an ECC decoding.

Referring to FIGS. 19 and 21, in step S430, a data read request for a specific page may be received (step S441). For example, a read command and a read address may be received. Step S441 in FIG. 21 may be similar to step S431 in FIG. 20.

Data and parity data stored in the page corresponding to the data read request may be read or retrieved (step S443). Based on the parity data read in step S443, the read data may be recovered (or restored) and output (step S445). Step S443 in FIG. 21 may be similar to step S435 or step S437 in FIG. 20, and step S445 in FIG. 21 may be similar to step S439 in FIG. 20. For example, when the first data DAT_1 in FIG. 16 is to be read, the first data DAT_1 and the portion PD_11 of the first parity data PD_1 stored in the first page P_1 may be read in step S443, and the first data DAT_1 may be recovered based on the portion PD_11 of the first parity data PD_1. For example, when the second data DAT_(N+1) in FIG. 16 is to be read, steps S443 and S445 in FIG. 21 may be substantially the same as steps S437 and S439 in FIG. 20, respectively.

When the data recovery operation in step S445 succeeds (step S447: NO), the data read operation or process may be successfully completed. When the data recovery operation in step S445 is failed (step S447: YES), it may be checked whether at least a portion of the parity data associated with the data to be read corresponding to the data read request is stored in another page (step S451). Step S451 in FIG. 21 may be substantially the same as step S433 in FIG. 20.

When the at least a portion of the parity data is stored in the another page (step S451: YES), the parity data stored in the another page may be additionally read or retrieved (step S453). Based on the parity data read in steps S443 and S453, the read data may be additionally recovered and output (step S455). For example, when the first data DAT_1 in FIG. 16 is to be read, the first data DAT_1 may be additionally recovered based on all of the first parity data PD_1.

When the data recovery operation in step S445 is failed (step S447: YES), and when the at least a portion of the parity data is not stored in the another page (step S451: NO), another data recovery scheme (e.g., an ECC scheme) may be applied or a data recovery failure (e.g., an ECC failure) may be declared (step S457).

In some example embodiments, in a sequential read operation where data read operations are continuously or sequentially performed on a plurality of pages, data may be continuously stored in pages included in page pairs, and thus parity data stored in all of pages of page pairs may be read while the data read operations are continuously or sequentially performed. Therefore, only the last page needs to be checked for the parity integrity in the same manner as in a random read operation.

Figure 22:
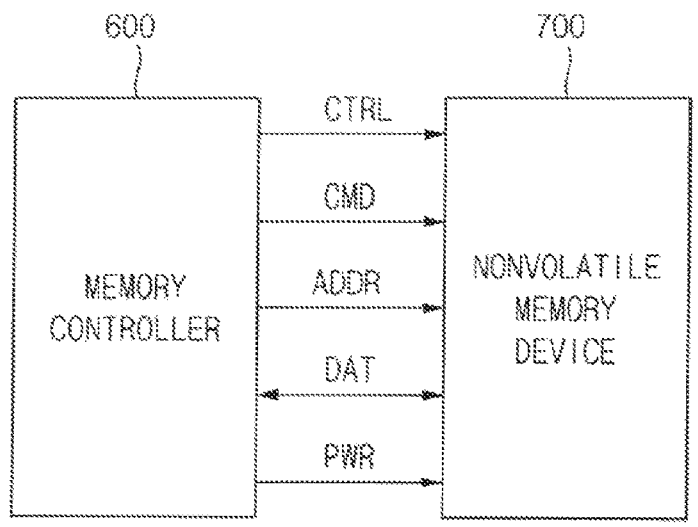
FIG. 22 is a block diagram illustrating a memory system according to example embodiments.

FIG. 22 is a block diagram illustrating a memory system according to example embodiments.

Referring to FIG. 22, a memory system 500 includes a memory controller 600 and at least one nonvolatile memory device 700.

The nonvolatile memory device 700 may correspond to the nonvolatile memory device according to one or more example embodiments described with reference to FIGS. 1 through 21, and may perform data erase, program (or write) and/or read operations under control of the memory controller 600. The nonvolatile memory device 700 may receive a command CMD and an address ADDR through I/O lines from the memory controller 600 for performing such operations, and may exchange data DAT with the memory controller 600 for performing such program or read operation. In addition, the nonvolatile memory device 700 may receive a control signal CTRL through a control line from the memory controller 600. In addition, the nonvolatile memory device 700 receives a power PWR through a power line from the memory controller 600.

Figure 23:
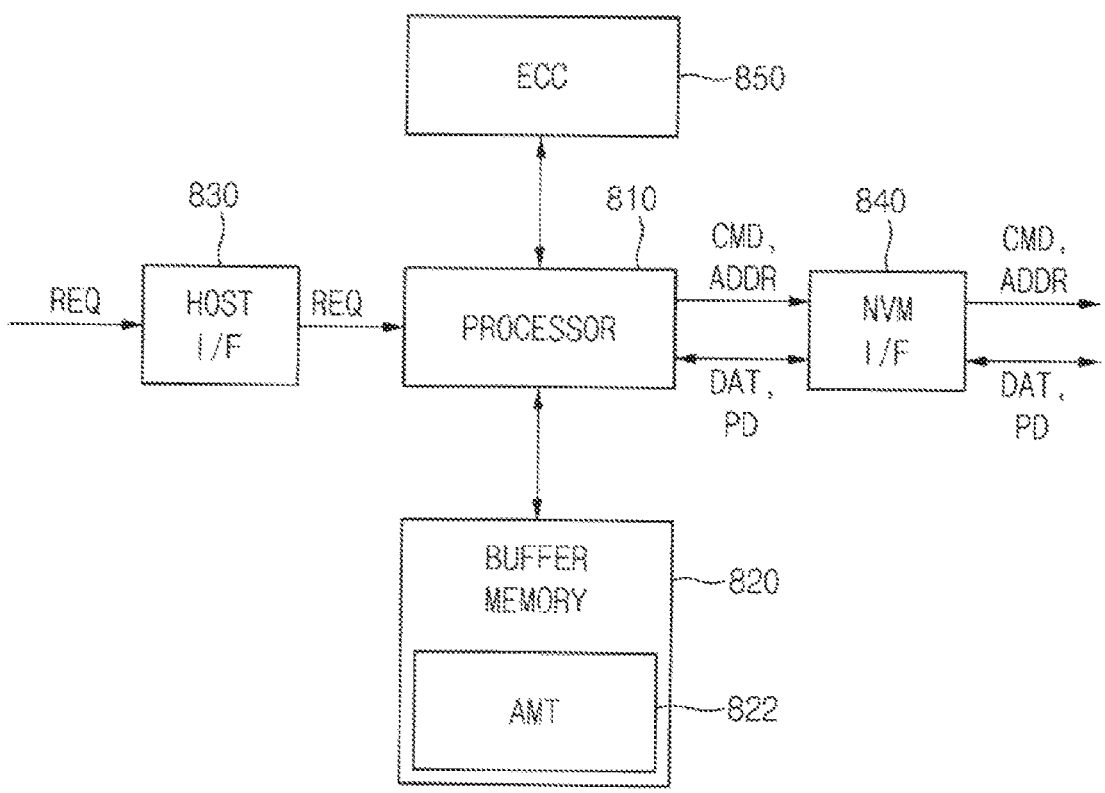
FIG. 23 is a block diagram illustrating a memory controller according to example embodiments.

FIG. 23 is a block diagram illustrating a memory controller according to example embodiments.

Referring to FIG. 23, a memory controller 800 includes at least one processor 810, a buffer memory 820, a host interface 830, a nonvolatile memory interface 840 and an error correction code (ECC) engine 850.

The processor 810 may control an operation of the memory controller 800 in response to a command received via the host interface 830 from an external host device (not illustrated). In some example embodiments, the processor 810 may control respective components by employing firmware for operating a nonvolatile memory device (e.g., the nonvolatile memory device 700 of FIG. 22).

The buffer memory 820 may store instructions and data executed and processed by the processor 810. For example, the buffer memory 820 may store an address mapping table 822. For example, the buffer memory 820 may be implemented with a volatile memory device such as a dynamic random access memory (DRAM), a static random access memory (SRAM), a cache memory, or the like.

The host interface 830 may provide physical connections between the host device and the memory controller 800. The host interface 830 may provide an interface corresponding to a bus format of the host for communication between the host device and the memory controller 800. In some example embodiments, the bus format of the host device may be a small computer system interface (SCSI) or a serial attached SCSI (SAS) interface. In other example embodiments, the bus format of the host device may be a USB, a peripheral component interconnect (PCI) express (PCIe), an advanced technology attachment (ATA), a parallel ATA (PATA), a serial ATA (SATA), a nonvolatile memory (NVM) express (NVMe), etc., format.

The nonvolatile memory interface 840 may exchange data with the nonvolatile memory device. The nonvolatile memory interface 840 may transfer data to the nonvolatile memory device, or may receive data read from the nonvolatile memory device 100. In some example embodiments, the nonvolatile memory interface 840 may be connected to the nonvolatile memory device via one channel. In other example embodiments, the nonvolatile memory interface 840 may be connected to the nonvolatile memory device via two or more channels.

The ECC block 850 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The memory controller 800 may control the nonvolatile memory device to perform the method according to one or more example embodiments. For example, the processor 810 may generate a command CMD and an address ADDR based on a request REQ received from the host device via the host interface 830, and may provide the command CMD and the address ADDR to the nonvolatile memory device via the nonvolatile memory interface 840. The processor 810 may set and/or manage the page pairs as described with reference to FIGS. 1 and 7 through 11. When a data write operation is to be performed, the ECC engine 850 may generate data DAT and parity data PD, and may provide the data DAT and the parity data PD to the nonvolatile memory device via the processor 810 and the nonvolatile memory interface 840. For example, as described with reference to FIGS. 12 through 18, parity data having different sizes may be generated depending on the channel hole size and the reliability of the page. When a data read operation is to be performed, the ECC engine 850 may receive data the DAT and the parity data PD from the nonvolatile memory device, and may performs a data recovery operation. For example, as described with reference to FIGS. 19 through 21, the data may be recovered based on some or all of the parity data. For example, the address mapping table (AMT) 822 stored in the buffer memory 820 may include a page pair mapping table (e.g., the page pair mapping table 162 in FIG. 2), and a size of parity data and/or a data recovery scheme may be determined using the address mapping table 822.

Figure 24:
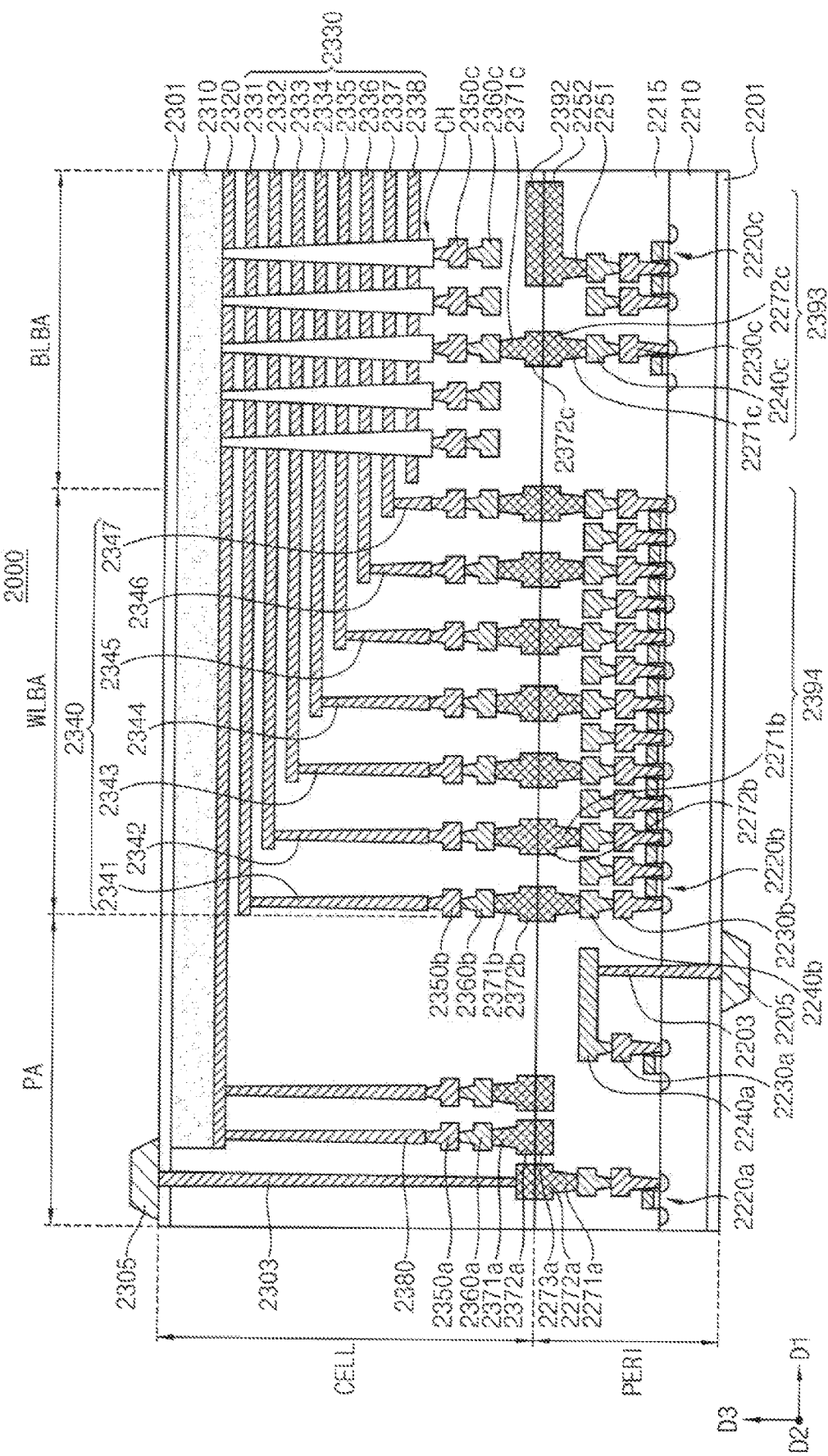
FIG. 24 is a cross-sectional view of a nonvolatile memory device according to example embodiments.

FIG. 24 is a cross-sectional view of a nonvolatile memory device according to example embodiments.

Referring to FIG. 24, a nonvolatile memory device or a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a wordline bonding area WLBA, and a bitline bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c respectively formed on the first metal layers 2230a, 2230b, and 2230c. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrate in FIG. 24, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of wordlines 2331, 2332, 2333, 2334, 2335, 2336, 2337, and 2338 (collectively, 2330) may be stacked in a third direction D3 (e.g., a Z-axis direction), perpendicular to an upper surface of the second substrate 2310. At least one string selection line and at least one ground selection line may be arranged on and below the plurality of wordlines 2330, respectively, and the plurality of wordlines 2330 may be disposed between the at least one string selection line and the at least one ground selection line.

In the bitline bonding area BLBA, a channel structure CH may extend in the third direction D3 (e.g., the Z-axis direction), perpendicular to the upper surface of the second substrate 2310, and pass through the plurality of wordlines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bitline contact, and the second metal layer 2360c may be a bitline. In an example embodiment, the bitline 2360c may extend in a second direction D2 (e.g., a Y-axis direction), parallel to the upper surface of the second substrate 2310.

In an example embodiment illustrated in FIG. 24, an area in which the channel structure CH, the bitline 2360c, and the like are disposed may be defined as the bitline bonding area BLBA. In the bitline bonding area BLBA, the bitline 2360c may be electrically connected to the circuit elements 2220c that provides a page buffer 2393 in the peripheral circuit region PERI. The bitline 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the wordline bonding area WLBA, the plurality of wordlines 2330 may extend in a first direction D1 (e.g., an X-axis direction), parallel to the upper surface of the second substrate 2310 and perpendicular to the second direction D2, and may be connected to a plurality of cell contact plugs 2341, 2342, 2343, 2344, 2345, 2346, and 2347 (collectively, 2340). The plurality of wordlines 2330 and the plurality of cell contact plugs 2340 may be connected to each other in pads provided by at least a portion of the plurality of wordlines 2330 extending in different lengths in the first direction D1. A first metal layer 2350b and a second metal layer 2360b may be sequentially connected to an upper portion of the plurality of cell contact plugs 2340 that are connected to the plurality of wordlines 2330. The plurality of cell contact plugs 2340 may be connected to the peripheral circuit region PERI via the upper bonding metals 2371b and 2372b of the cell region CELL and the lower bonding metals 2271b and 2272b of the peripheral circuit region PERI in the wordline bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be sequentially stacked on an upper portion of the common source line contact plug 2380. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating film 2301. The second input/output pad 2305 may be connected to at least one of the plurality of circuit elements 2220a, 2220b, and 2220c disposed in the peripheral circuit region PERI through a second input/output contact plug 2303. In the example embodiment, the second input/output pad 2305 is electrically connected to the circuit element 2220a.

According to embodiments, the second substrate 2310 and the common source line 2320 may not be disposed in an area in which the second input/output contact plug 2303 is disposed. Also, the second input/output pad 2305 may not overlap the wordlines 2330 in the third direction D3 (e.g., the Z-axis direction). The second input/output contact plug 2303 may be separated from the second substrate 2310 in a direction, parallel to the upper surface of the second substrate 310, and may pass through the interlayer insulating layer 2315 of the cell region CELL to be connected to the second input/output pad 2305.

According to example embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern provided on an uppermost metal layer may be provided as a dummy pattern or the uppermost metal layer may be absent, in each of the external pad bonding area PA and the bitline bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the wordline bonding area WLBA. In the wordline bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bitline bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The memory device 2000 may be implemented to perform the method of operating the nonvolatile memory device according to example embodiments.

Figure 25:
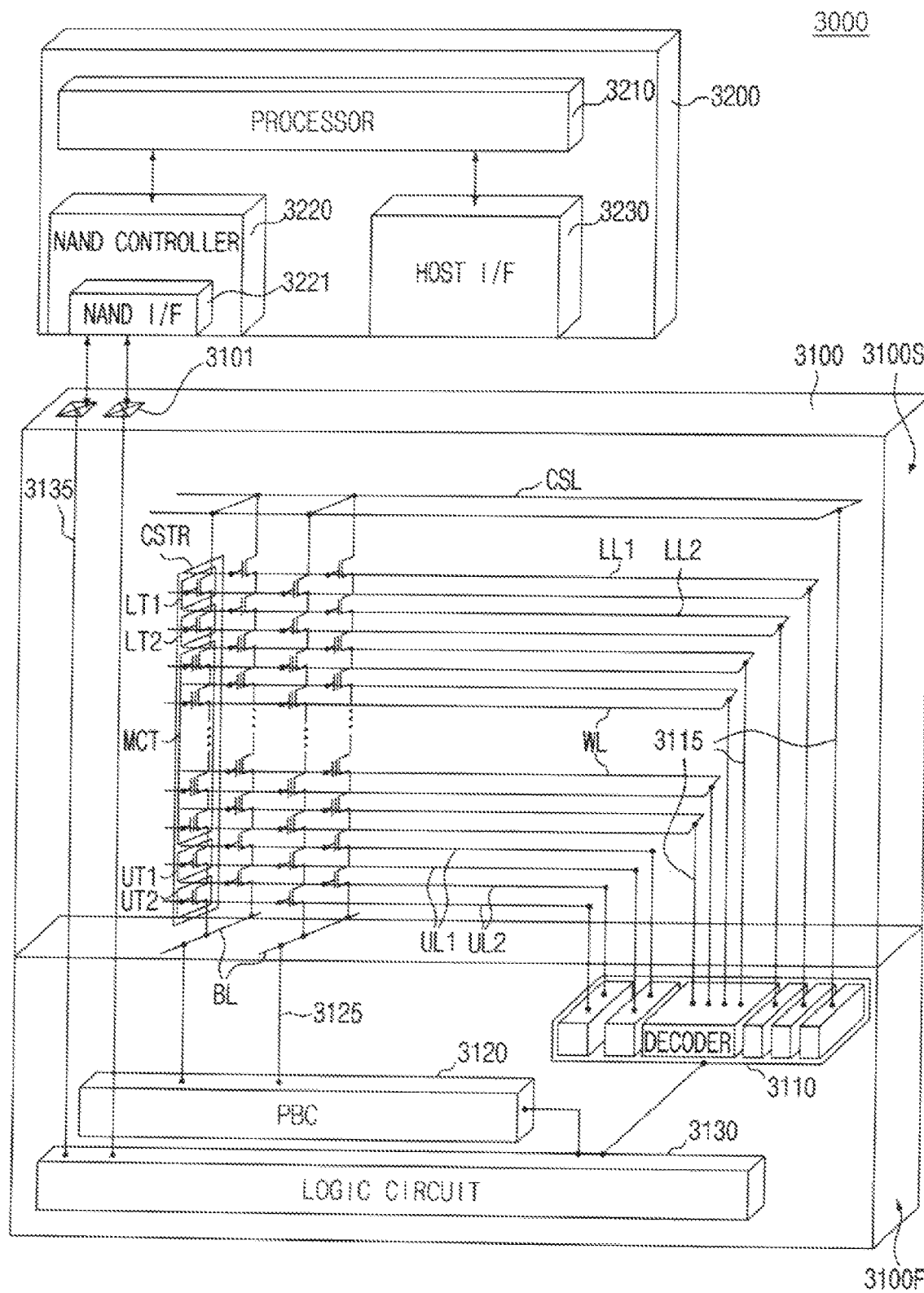
FIG. 25 is a block diagram illustrating an electronic system including a nonvolatile memory device according to example embodiments.

FIG. 25 is a block diagram illustrating an electronic system including a nonvolatile memory device according to example embodiments.

Referring to FIG. 25, an electronic system 3000 may include a semiconductor device 3100 and a controller 3200 electrically connected to the semiconductor device 3100. The electronic system 3000 may be a storage device including one or a plurality of semiconductor devices 3100 or an electronic device including the storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be a memory device, for example, the nonvolatile memory device according to example embodiments described with reference to FIG. 2. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including bitlines BL, a common source line CSL, wordlines WL, first and second upper gate lines UL1 and UL2, first and second lower gate lines LL1 and LL2, and memory cell strings CSTR between the bitlines BL and the common source line CSL.

In the second structure 3100S, each of the memory cell strings CSTR may include lower transistors LT1 and LT2 adjacent to the common source line CSL, upper transistors UT1 and UT2 adjacent to the bitlines BL, and a plurality of memory cell transistors MCT between the lower transistors LT1 and LT2 and the upper transistors UT1 and UT2.

In the first structure 3100F, the decoder circuit 3110, the page buffer circuit 3120 and the logic circuit 3130 may correspond to the address decoder 120, the page buffer circuit 130 and the control circuit 160 in FIG. 2, respectively.

The common source line CSL, the first and second lower gate lines LL1 and LL2, the wordlines WL, and the first and second upper gate lines UL1 and UL2 may be electrically connected to the decoder circuit 3110 through first connection wirings 3115 extending to the second structure 3110S in the first structure 3100F. The bitlines BL may be electrically connected to the page buffer circuit 3120 through second connection wirings 3125 extending along the second structure 3100S in the first structure 3100F. The input/output pad 3101 may be electrically connected to the logic circuit 3130 through an input/output connection wiring 3135 extending along the second structure 3100S in the first structure 3100F.

The controller 3200 may include a processor 3210, a NAND controller 3220 and a host interface 3230. The electronic system 3000 may include a plurality of semiconductor devices 3100, and in this case, the controller 3200 may control the plurality of semiconductor devices 3100. The processor 3210, a NAND interface 3221 included in the NAND controller 3220, and the host interface 3230 may correspond to the processor 810, the nonvolatile memory interface 840 and the host interface 830 in FIG. 23, respectively.

Figure 26:
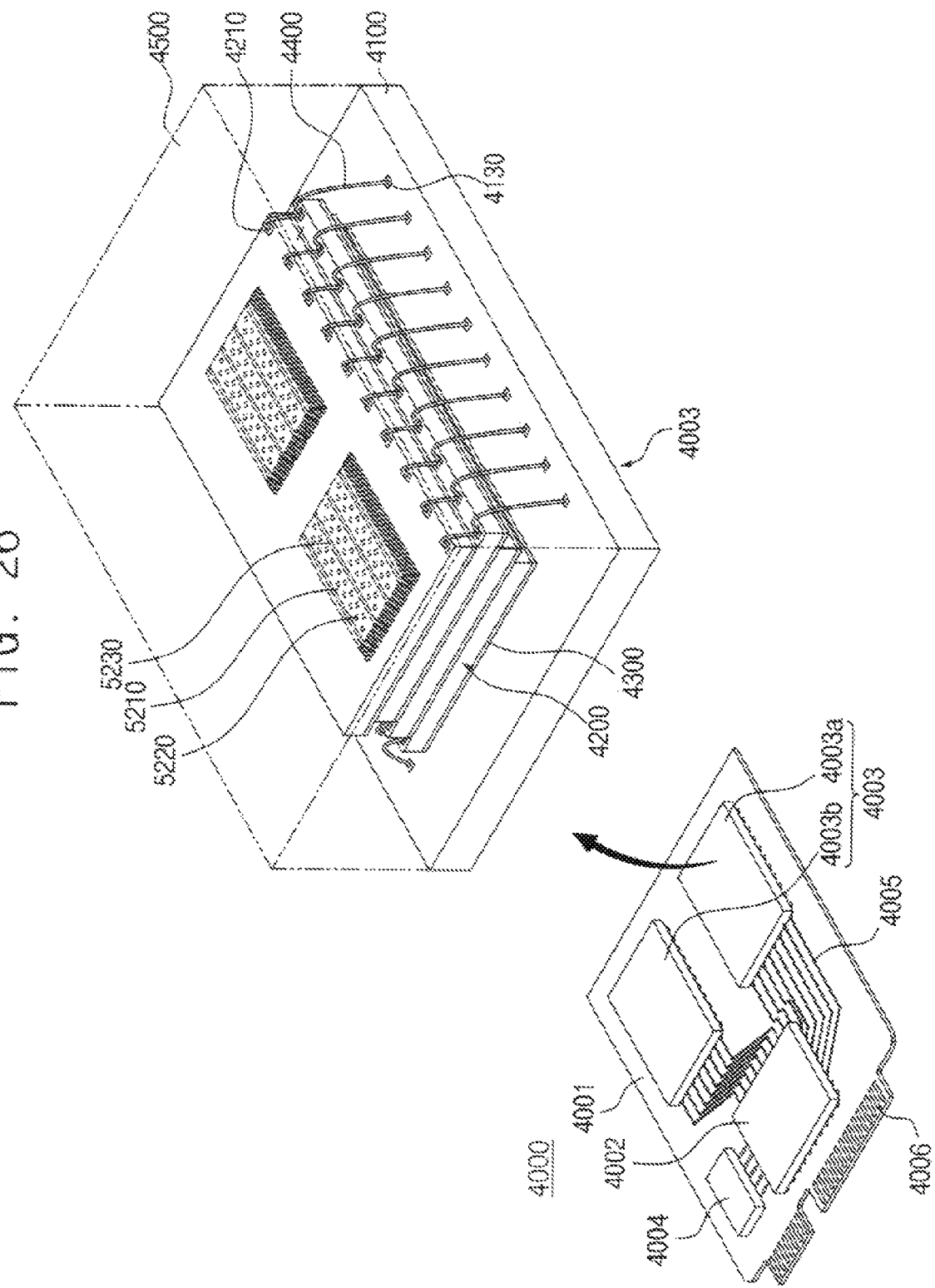
FIG. 26 is a perspective view of an electronic system including a nonvolatile memory device according to example embodiments.

FIG. 26 is a perspective view of an electronic system including a nonvolatile memory device according to example embodiments.

Referring to FIG. 26, an electronic system 4000 may include a main substrate 4001, a controller 4002 mounted on the main substrate 4001, at least one semiconductor package 4003, and a dynamic random access memory (DRAM) device 4004. The semiconductor package 4003 and the DRAM device 4004 may be connected to the controller 4002 by wiring patterns 4005 on the main substrate 4001.

The main substrate 4001 may include a connector 4006 having a plurality of pins connected to an external host. The number and layout of the plurality pins in the connector 4006 may be changed depending on a communication interface between the electronic system 4000 and the external host. In some example embodiments, the electronic system 4000 may be driven or may operate by a power source provided from the external host through the connector 4006.

The controller 4002 may write data in the semiconductor package 4003 or read data from the semiconductor package 4003, and may enhance an operation speed of the electronic system 4000.

The DRAM device 4004 may be a buffer memory for reducing the speed difference between the semiconductor package 4003 for storing data and the external host. The DRAM device 4004 included in the electronic system 4000 may serve as a cache memory, and may provide a space for temporarily storing data during the control operation for the semiconductor package 4003.

The semiconductor package 4003 may include first and second semiconductor packages 4003a and 4003b spaced apart from each other. The first and second semiconductor packages 4003a and 4003b may be semiconductor packages each of which includes a plurality of semiconductor chips 4200. Each of the first and second semiconductor packages 4003a and 4003b may include a package substrate 4100, the semiconductor chips 4200, bonding layers 4300 disposed under the semiconductor chips 4200, a connection structure 4400 for electrically connecting the semiconductor chips 4200 with the package substrate 4100, and a mold layer 4500 covering the semiconductor chips 4200 and the connection structure 4400 on the package substrate 4100.

The package substrate 4100 may be a printed circuit board (PCB) including package upper pads 4130. Each semiconductor chip 4200 may include an input/output pad 4210. The input/output pad 4210 may correspond to the input/output pad 3101 in FIG. 25. Each semiconductor chip 4200 may include gate electrode structures 5210, memory channel structures 5220 extending through the gate electrode structures 5210, and division structures 5230 for dividing the gate electrode structures 5210. Each semiconductor chip 4200 may include a nonvolatile memory device according to example embodiments described with reference to FIG. 2.

In some example embodiments, the connection structure 4400 may be a bonding wire for electrically connecting the input/output pad 4210 and the package upper pads 4130.

The nonvolatile memory device according to example embodiments may be packaged using various package types or package configurations.

The inventive concept may be applied to various electronic devices and systems that include the nonvolatile memory devices. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all of such modifications are intended to be included within the scope of the disclosure as defined in the claims and their equivalents. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating one or more nonvolatile memory devices, each nonvolatile memory device including one or more memory blocks, each memory block including a plurality of memory cells and a plurality of pages that are connected to a plurality of wordlines and arranged in a vertical direction, the method comprising:
    setting pages arranged in a first direction of a channel hole as a first page to an N-th page, N being a natural number greater than or equal to two, the channel hole extending in the vertical direction, a size of the channel hole increasing in the first direction;
    setting pages arranged in a second direction of the channel hole as an (N+1)-th page to a 2N-th page, the size of the channel hole decreasing in the second direction;
    setting a first page pair to an N-th page pair such that a K-th page, among the first to the N-th pages, and an (N+K)-th page, among the (N+1)-th to the 2N-th pages, form one page pair, K being a natural number greater than or equal to one and less than or equal to N; and
    driving the first to the N-th page pairs such that parity regions of two pages included in at least one page pair of the first to the N-th page pairs are shared by the two pages included in the at least one page pair.

2. The method of claim 1, wherein:
    the channel hole has a first portion to an N-th portion respectively corresponding to the first to the N-th pages and an (N+1)-th portion to an 2N-th portion respectively corresponding to the (N+1)-th to the 2N-th pages,
    the first to the N-th portions of the channel hole have a first size to an N-th size, respectively,
    the first size is a smallest size among the first to the N-th sizes, and the N-th size is a largest size among the first to the N-th sizes,
    the (N+1)-th to the 2N-th portions of the channel hole have an (N+1)-th size to an 2N-th size, respectively, and
    the (N+1)-th size is a largest size among the (N+1)-th to the 2N-th sizes, and the 2N-th size is a smallest size among the (N+1)-th to the 2N-th sizes.

3. The method of claim 2, wherein:
    the first to the N-th pages are included in a first memory block included in a first nonvolatile memory device, and are sequentially arranged along a first channel hole included in the first memory block, and
    the (N+1)-th to the 2N-th pages are included in a second memory block included in a second nonvolatile memory device different from the first nonvolatile memory device, and are sequentially arranged along a second channel hole included in the second memory block.

4. The method of claim 2, wherein:
    the first to the N-th pages and the (N+1)-th to the 2N-th pages are included in a first memory block included in a first nonvolatile memory device, and are sequentially arranged along a first channel hole included in the first memory block, and
    both the first page and the (N+1)-th page are provided at edge portions of the first memory block.

5. The method of claim 2, wherein:
    the first to the N-th pages and the (N+1)-th to the 2N-th pages are included in a first memory block included in a first nonvolatile memory device,
    the first memory block includes a first channel hole, and the first channel hole includes a first sub-channel hole and a second sub-channel hole stacked in the vertical direction, and the first to the N-th pages are sequentially arranged along the first sub-channel hole, and the (N+1)-th to the 2N-th pages are sequentially arranged along the second sub-channel hole.

6. The method of claim 5, wherein:
the first memory block further includes an (2N+1)-th page to an (2N+J)-th page, J being a natural number greater than or equal to two,
the (2N+1)-th to the (2N+J)-th pages are sequentially arranged along the first sub-channel hole together with the first to the N-th pages,
the first sub-channel hole has an (2N+1)-th portion to an (2N+J)-th portion corresponding to the (2N+1)-th to (2N+J)-th pages, respectively, and the (2N+1)-th to the (2N+J)-th portions have an (2N+1)-th size to an (2N+J)-th size, respectively, and
the (2N+1)-th to the (2N+J)-th sizes are larger than the N-th size.

7. The method of claim 5, wherein:
the first memory block includes a first sub-block and a second sub-block,
the first to the N-th pages are included in the first sub-block, and the (N+1)-th to the 2N-th pages are included in the second sub-block, and
the first sub-block and the second sub-block are independently programmed and erased.

8. The method of claim 2, wherein:
the first to the N-th pages and the (N+1)-th to the 2N-th pages are included in a first memory block, the first memory block being included in a first nonvolatile memory device,
the first memory block includes a first channel hole, and the first channel hole includes a first sub-channel hole and a second sub-channel hole stacked in the vertical direction,
the first page to an M-th page, among the first to the N-th pages, and the (N+1)-th page to an (N+M)-th page, among the (N+1)-th to the 2N-th pages, are sequentially arranged along the first sub-channel hole, M being a natural number greater than or equal to two and less than N, and
an (M+1)-th page to the N-th page, among the first to the N-th pages, and an (N+M+1)-th page to the 2N-th page, among the (N+1)-th to the 2N-th pages, are sequentially arranged along the second sub-channel hole.

9. The method of claim 2, wherein:
the first to the N-th pages are included in a first memory block, and the (N+1)-th to the 2N-th pages are included in a second memory block different from the first memory block,
the first memory block includes a first channel hole, and the first channel hole includes a first sub-channel hole and a second sub-channel hole stacked in the vertical direction,
the second memory block includes a second channel hole, and the second channel hole includes a third sub-channel hole and a fourth sub-channel hole stacked in the vertical direction, and
the first to the N-th pages are sequentially arranged along the first sub-channel hole, and the (N+1)-th to the 2N-th pages are sequentially arranged along the fourth sub-channel hole.

10. The method of claim 1, wherein:
the first to the N-th pages and the (N+1)-th to the 2N-th pages are included in a first memory block, the first memory block being included in a first nonvolatile memory device, and are sequentially arranged along a first channel hole included in the first memory block, and
the first page is provided at an edge portion of the first memory block, and the (N+1)-th page is disposed at a center portion of the first memory block.

11. The method of claim 1, wherein the driving the first to the N-th page pairs includes:
performing a data write operation on the first page pair including the first page and the (N+1)-th page.

12. The method of claim 11, wherein the performing the data write operation on the first page pair includes:
receiving first data to be stored in the first page, second data to be stored in the (N+1)-th page, first parity data associated with the first data, and second parity data associated with the second data;
storing the first data and a portion of the first parity data in the first page; and
storing the second data, the second parity data, and a remaining portion of the first parity data in the (N+1)-th page.

13. The method of claim 12, wherein the driving the first to the N-th page pairs further includes:
performing a data write operation on an X-th page pair including an X-th page and an (N+X)-th page, X being a natural number greater than or equal to two and less than or equal to N/2.

14. The method of claim 13, wherein the performing the data write operation on the X-th page pair includes:
receiving third data to be stored in the X-th page, fourth data to be stored in the (N+X)-th page, third parity data associated with the third data, and fourth parity data associated with the fourth data;
storing the third data and a portion of the third parity data in the X-th page; and
storing the fourth data, the fourth parity data, and a remaining portion of the third parity data in the (N+X)-th page.

15. The method of claim 14, wherein:
a size of the first parity data and a size of the third parity data are different from each other, and
a size of the second parity data and a size of the fourth parity data are different from each other.

16. The method of claim 12, wherein the driving the first to the N-th page pairs further includes:
performing a data read operation on the first page pair.

17. The method of claim 16, wherein the performing the data read operation on the first page pair includes:
based on the first data being to be read, retrieving the first data and the portion of the first parity data that are stored in the first page and the remaining portion of the first parity data that is stored in the (N+1)-th page; and
recovering the first data based on the portion and the remaining portion of the first parity data.

18. The method of claim 16, wherein the performing the data read operation on the first page pair includes:
based on the first data being to be read, retrieving the first data and the portion of the first parity data that are stored in the first page;
recovering the first data based on the portion of the first parity data;
additionally retrieving the remaining portion of the first parity data that is stored in the (N+1)-th page; and
additionally recovering the first data based on the portion and the remaining portion of the first parity data.

19. A nonvolatile memory device comprising:
one or more memory blocks, each memory block including a plurality of memory cells and a plurality of pages that are connected to a plurality of wordlines and arranged in a vertical direction, each memory block including a channel hole that extends in the vertical direction; and
a control circuit configured to control an operation of the memory block,
wherein the control circuit is further configured to:
- set pages arranged in a first direction of the channel hole as a first page to an N-th page, N being a natural number greater than or equal to two, a size of the channel hole increasing in the first direction;
- set pages arranged in a second direction of the channel hole as an (N+1)-th page to an 2N-th page, the size of the channel hole decreasing in the second direction;
- set a first page pair to an N-th page pair such that a K-th page, among the first to the N-th pages, and an (N+K)-th page, among the (N+1)-th to the 2N-th pages, form one page pair, K being a natural number greater than or equal to one and less than or equal to N; and
- drive the first to the N-th page pairs such that parity regions of two pages included in at least one page pair of the first to the N-th page pairs are shared by the two pages included in the at least one page pair.

20. A method of operating one or more nonvolatile memory devices including one or more memory blocks, each memory block including a plurality of memory cells and a plurality of pages that are connected to a plurality of wordlines and arranged in a vertical direction, the method comprising:

setting pages arranged in a first direction of a channel hole as a first page to an N-th page, N being a natural number greater than or equal to two, the channel hole extending in the vertical direction, a size of the channel hole increasing in the first direction;

setting pages arranged in a second direction of the channel hole as an (N+1)-th page to an 2N-th page, the size of the channel hole decreasing in the second direction;

setting a first page pair to an N-th page pair such that a K-th page, among the first to the N-th pages, and an (N+K)-th page, among the (N+1)-th to the 2N-th pages, form one page pair, K being a natural number greater than or equal to one and less than or equal to N;

performing a data write operation on the first page pair including the first page and the (N+1)-th page by receiving first data, second data, first parity data associated with the first data, and second parity data associated with the second data, by storing the first data and a portion of the first parity data in the first page, and by storing the second data, the second parity data, and a remaining portion of the first parity data in the (N+1)-th page; and performing a data read operation on the first page pair by retrieving the first data and the portion of the first parity data that are stored in the first page and the remaining portion of the first parity data that is stored in the (N+1)-th page, and by recovering the first data based on the portion of the first parity data or based on the portion and the remaining portion of the first parity data.

* * * * *